(12) United States Patent
Ino

(10) Patent No.: US 8,017,448 B2
(45) Date of Patent: Sep. 13, 2011

(54) METHOD FOR MANUFACTURING SEMICONDUCTOR DEVICE

(75) Inventor: Yoshihiko Ino, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 362 days.

(21) Appl. No.: 12/382,075

(22) Filed: Mar. 9, 2009

(65) Prior Publication Data

US 2009/0263938 A1    Oct. 22, 2009

(30) Foreign Application Priority Data

Apr. 18, 2008   (JP) ................. 2008-109176

(51) Int. Cl.
*H01L 23/48* (2006.01)
*H01L 23/28* (2006.01)

(52) U.S. Cl. ........ 438/124; 438/107; 257/739; 257/687; 257/E23.116; 257/E23.141

(58) Field of Classification Search .............. 438/124, 438/107, 125, 127; 257/E21.502, E23.011, 257/E23.116, E23.123, E23.141, 787, 739, 257/773, 687, 690

See application file for complete search history.

(56) References Cited

U.S. PATENT DOCUMENTS

| | | | |
|---|---|---|---|
| 2004/0198057 A1* | 10/2004 | Huang et al. | 438/694 |
| 2007/0161266 A1* | 7/2007 | Nishizawa | 439/69 |
| 2007/0164457 A1* | 7/2007 | Yamaguchi et al. | 257/787 |

FOREIGN PATENT DOCUMENTS

| | | |
|---|---|---|
| JP | 11-260999 | 9/1999 |
| JP | 2009-004650 | 1/2009 |

* cited by examiner

*Primary Examiner* — Matthew Smith
*Assistant Examiner* — Michele Fan
(74) *Attorney, Agent, or Firm* — Rabin & Berdo, PC

(57) ABSTRACT

In a double-sided electrode package, a sealing resin layer is formed so as to fill peripheries of surface-side terminals formed on a package substrate. Since the side surfaces of the surface-side terminals have plural protruded rims, adhesion with the sealing resin layer is improved by an anchor effect. At a sealing step, since supplied liquid resin is naturally flowed to form the sealing resin layer, a "mold step" and a "grinding step" may be omitted, and thus the sealing step may be simplified more greatly than a case where the resin sealing is carried out by a transfer molding method.

8 Claims, 20 Drawing Sheets

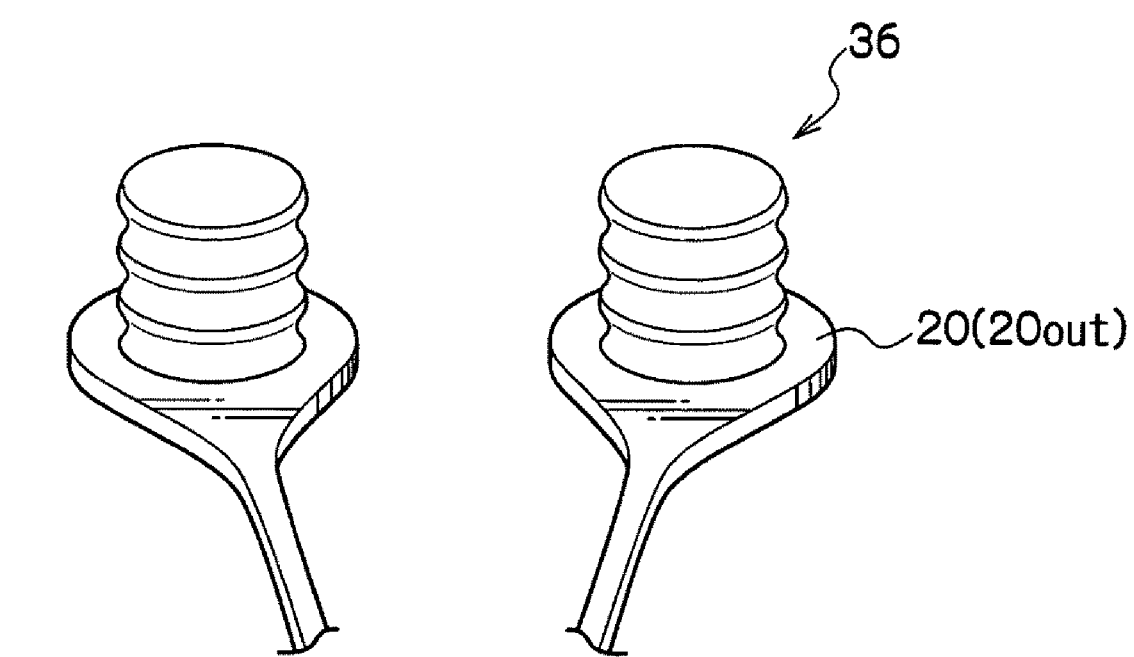

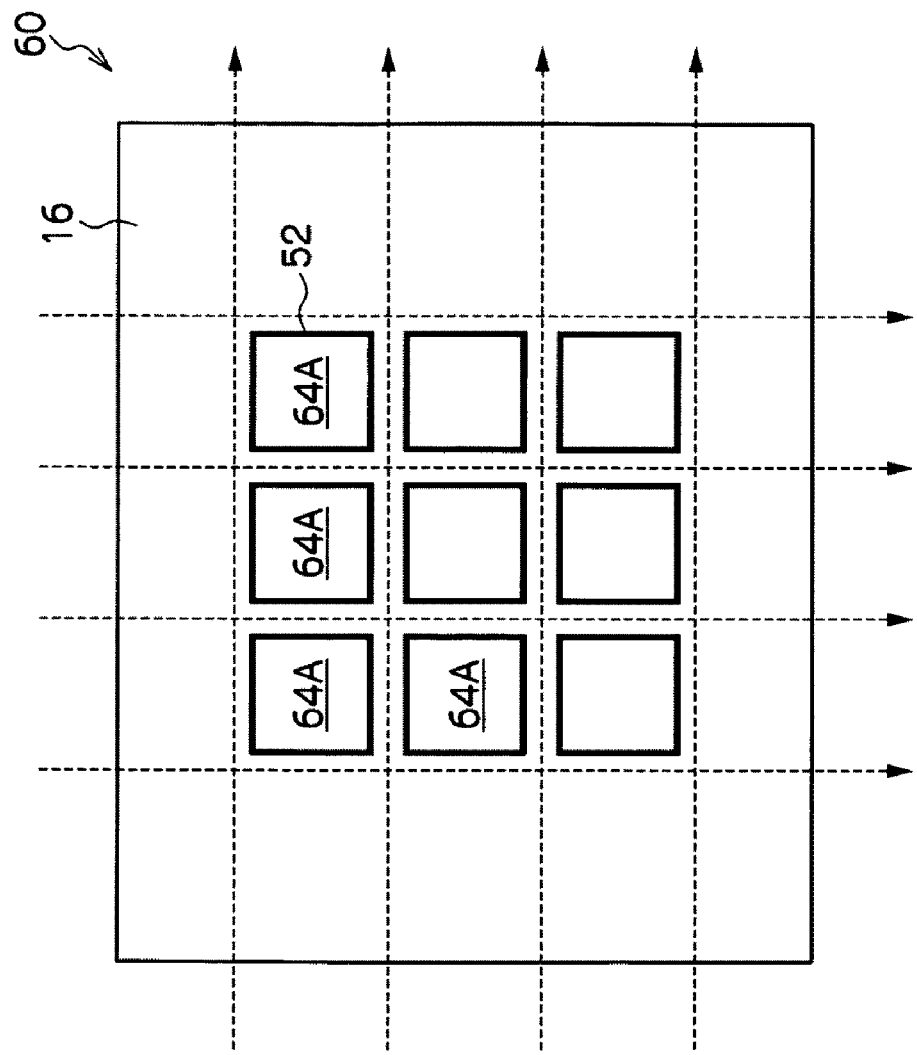

METHOD FOR MANUFACTURING SEMICONDUCTOR DEVICE

CROSS-REFERENCE TO RELATED APPLICATION

This application claims priority under 35 USC 119 from Japanese Patent Application No. 2008-109176, the disclosure of which is incorporated by reference herein.

BACKGROUND OF THE INVENTION

1. Field of the Invention

The present invention relates to a method for manufacturing semiconductor device. The invention particularly relates to the method for manufacturing semiconductor device having a double-sided electrode structure (double-sided electrode package).

2. Description of the Related Art

Recently, three-dimensional package techniques with higher packaging density are being developed according to miniaturization of electronic devices such as mobile telephones. In the three-dimensional package techniques, a package-on-package (POP) method for laminating another package on one package is one of promising candidates. In POP, lamination of multi-layered packages having three or four layers is also proposed (see Japanese Patent Application Laid-Open (JP-A) No. 11-260999).

FIG. 18 illustrates a representative structure of conventional POP. In the POP structure, another package 2 is laminated on a package 1. In the lower package 1, semiconductor chips are connected in a flip-chip manner. The package 1 is provided with solder balls as connection terminals on its back surface side, and provided with a land portion obtained by applying solider paste to its surface side.

In the upper package 2, the semiconductor chips are connected by wire bonding, and are sealed by a resin. The package 2 is also provided with land portions as connection terminals on its back surface side. The land portions of the package 2 are provided at positions opposed to the package 1 in a laminated state. The land portions of the upper package 2 are electrically connected to the land portions of the lower package 1 by the solder balls 3.

However, the conventional POP has the following various problems, for example:
(1) since the packages are laminated, a mounting height should not be lower than a stack of semiconductor chips;
(2) when the packages are warped, electric connection reliability is deteriorated;
(3) since sealing of the lower package is not sufficient, moisture-resistant reliability is deteriorated; and
(4) since reduction in a diameter of the solder balls provided as the connection terminals onto the package is limited, the solder balls cannot cope with a multi-pin constitution of the semiconductor chips.

These problems arise from the structure of the packages to be laminated.

In the POP, a double-sided electrode package is used. The double-sided electrode package has at least an internal wiring to be connected to a semiconductor chip, a penetrating electrode which connects an electrode on a package surface side and the internal wiring, and another penetrating electrode which connects an electrode on a package back surface side and the internal wiring. In order to solve the problems of the conventional POP, a double-sided electrode package which has a structure with excellent reliability, productivity and general versatility should be developed.

The inventors propose a double-sided electrode package (semiconductor device) with a new structure which has a pillar-shaped surface-side terminal having plural protruded rims on an entire periphery of its side surface along a peripheral direction as a "penetrating electrode". In this semiconductor device, adhesiveness between the surface-side terminal and a sealing resin is improved (see Japanese Patent Application Laid-Open (JP-A) No. 2009-004650). As a result, the device has an effect such that connection reliability and moisture-resistant reliability with respect to another package are excellent. JP-A No. 2009-004650 discloses a method for manufacturing the semiconductor device is a method for forming a sealing resin layer using a conventional resin sealing method such as a transfer molding method and grinding the sealing resin layer so as to expose one end of the surface-side terminal.

SUMMARY OF THE INVENTION

The present invention relates to improvement of the method for manufacturing the semiconductor device, and an object of the invention is to provide a method for manufacturing semiconductor device which enables manufacturing of a double-sided electrode package having a structure with excellent connection reliability and moisture-resistant reliability with respect to another package more easily and inexpensively than a case using the conventional resin sealing method such as the transfer molding method.

In order to achieve the above object, the present invention provides a method for manufacturing a semiconductor device, the method including:

a) forming electrode pads to be electrically connected to electrodes of semiconductor chips on a surface of a package substrate and forming external connection pads electrically connected to the electrode pads on a back surface of the package substrate;

b) laminating a metal film on the surface of the package substrate, forming a surface mask having a predetermined pattern on a surface of the metal film, the pattern being such that a plurality of pillar-shaped surface-side terminals, whose one ends are correspondingly electrically connected to the electrode pads, is formed on a peripheral portion on the surface of the package substrate, and etching the metal film to a predetermined depth using the surface mask to form pillar-shaped portions whose side surfaces are narrowed;

c) repeating:
   i) a procedure for forming side surface masks for protecting the side surfaces of the pillar-shaped portions formed by etching; and
   ii) a procedure for etching the metal film to a predetermined depth using the side surface masks and the surface masks so as to form the pillar-shaped portions whose side surfaces are narrowed,
until the package substrate is exposed, and
removing the surface mask and the side surface mask after the package substrate is exposed, to form pillar-shaped surface-side terminals having a plurality of protruded rims formed over entire peripheries of their side surfaces along a peripheral direction;

d) placing the semiconductor chips at a center of the surface of the package substrate and electrically connecting the electrodes to the electrode pads; and e) coating the surface of the package substrate with liquid resin so that the other ends of the surface-side terminals are exposed and the semiconductor chips are coated to seal the semiconductor chips with the liquid resin.

At the sealing of the semiconductor chips with the liquid resin, it is preferable that surfaces of the liquid resin is lower than the other ends of the surface-side terminals, and side surfaces of the surface-side terminals are coated with the liquid resin due to the surface tension of the liquid resin.

At the sealing of the semiconductor chips with the liquid resin, a partitioning member which holds up the liquid resin is arranged outside the peripheral portion on the surface of the package substrate so as to surround the peripheral portion, and after the arrangement of the partitioning member, the liquid resin is injected so as to cover the surface of the package substrate.

At the sealing of the semiconductor chips with the liquid resin, the liquid resin is allowed to remain near and inside the plural pillar-shaped surface-side terminals arranged at the peripheral portion on the surface of the package substrate by means of surface tension of the liquid resin so as to cover the surface of the package substrate.

According to the invention, the double-sided electrode package where reliability of connection to another package and moisture-resistant reliability are excellent may be manufactured more simply and inexpensively than a case of using a conventional resin sealing method such as a transfer molding method.

BRIEF DESCRIPTION OF THE DRAWINGS

Preferred exemplary embodiments of the present invention will be described in detail based on the following figures, wherein:

FIG. 3 is a perspective view illustrating a shape of a surface-side terminal;

FIGS. 13A and 13B are diagrams illustrating manufacturing steps according to the second exemplary embodiment, and particularly the diagrams illustrating dicing step;

DETAILED DESCRIPTION OF THE INVENTION

Exemplary embodiments of the present invention are described in detail below with reference to the drawings.

First Exemplary Embodiment

A first exemplary embodiment describes a method for manufacturing double-sided electrode package where a semiconductor chip is mounted to a package substrate formed with plural surface-side terminals having plural protruded rims on an entire periphery of their side surfaces along a peripheral direction, and the semiconductor chip is sealed by liquid resin. The first exemplary embodiment describes manufacturing steps of forming the structure of the double-sided electrode package on a substrate frame formed with plural package substrates so as to divide (separate) the substrate frame into individual double-sided electrode packages.

[Double-Sided Electrode Package]

Figure 1:
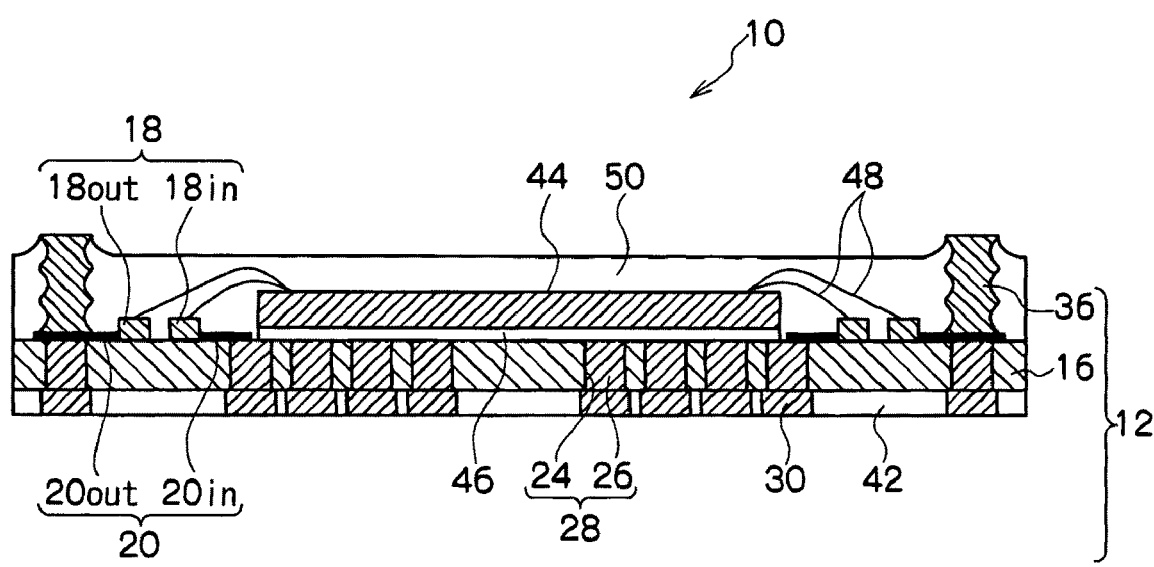
FIG. 1 is a schematic cross-sectional view illustrating a structure of a double-sided electrode package to be manufactured in a first exemplary embodiment of the invention.

FIG. 1 is a schematic cross-sectional view illustrating a structure of the double-sided electrode package to be manufactured in the first exemplary embodiment of the invention. The double-sided electrode package 10 has a flat-plate type core material 16 composed of an insulator such as resin or ceramics. Plural vias 24 which penetrate the core material 16 are formed on the core material 16. The vias 24 are filled with conductive material 26 so as to form penetrating electrodes 28. One ends of the penetrating electrodes 28 are exposed from the surface of the core material 16, and the other ends of the penetrating electrodes 28 are exposed from a back surface of the core material 16.

Plural electrode pads 18, plural surface-side terminals 36, and plural wirings 20 are formed on the surface of the core material 16 in a predetermined layout. The electrode pads 18 are for connecting a semiconductor chip 44 such as an LSI chip. The wirings 20 electrically connect the electrode pads 18 to one ends of the penetrating electrodes 28 or one ends of the surface-side terminals 36. Each of the surface-side terminals 36 has a pillar shape (post shape), and has plural protruded rims formed over an entire periphery of its side surface along a peripheral direction. A constitution of the surface-side terminals 36 is described in detail later. The plural electrode pads 18 are arranged in two rows, including an inside row and an outside row. The pillar-shaped surface-side terminals 36 stand on the wirings 20 formed on the surface of the core material 16 approximately vertically to the core material 16. The electrode pads 18 and the wirings 20 correspond to "electrode pads" of the invention.

Hereinafter, when the electrode pads 18 do not have to be distinguished between inside ones and outside ones, they are generally described as the electrode pads 18. On the other hand, when they should be distinguished between inside ones and outside ones, the inside electrode pads 18 are described as inside electrode pads $18_{in}$, and the outside electrode pads 18 are described as outside electrode pads $18_{out}$.

When the wirings 20 do not have to be distinguished between inside ones and outside ones, they are generally described as the wirings 20. On the other hand, when the outside and inside wirings 20 should be distinguished, the wirings 20 which connect the inside electrode pads $18_{in}$ and one ends of the penetrating electrodes 28 are described as inside wirings $20_{in}$, and the wirings 20 which connect the outside electrode pads $18_{out}$ and one ends of the surface-side terminals 36 are described as outside wirings $20_{out}$.

Plural lands 30 for external connection are formed on the back surface of the core material 16 so as to cover the exposed portions of the penetrating electrodes 28. The other ends of the penetrating electrodes 28 exposed from the back surface of the core material 16 are electrically connected to the lands 30. The back surface of the core material 16 is coated with solder resist 42 except for the lands 30.

Figure 6:
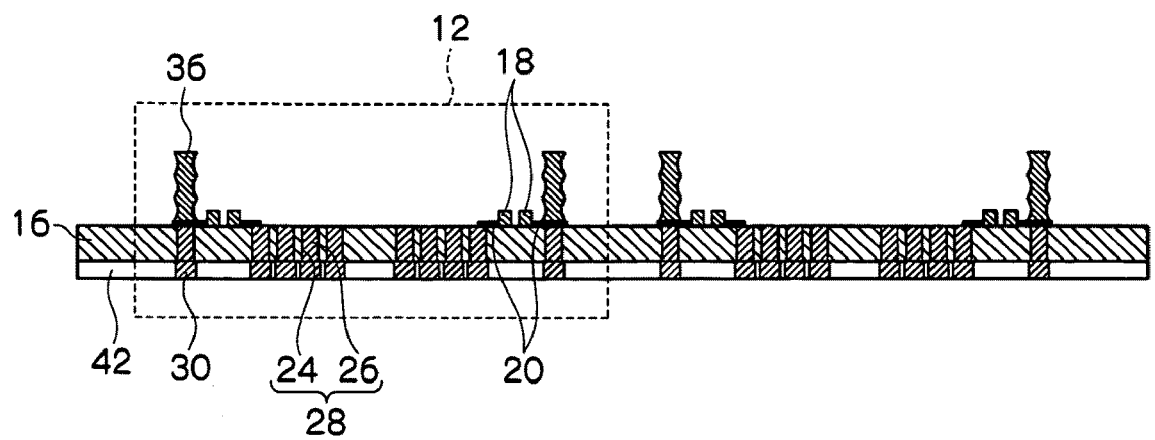
FIG. 6 is a diagram illustrating a manufacturing step according to the first exemplary embodiment and a partial cross-sectional view of the substrate frame shown in FIG. 5.

The core material 16 which is formed with the electrode pads 18, the wirings 20, the penetrating electrode 28, the lands 30 and the solder resist 42 is a package substrate 12 (see FIG. 6). The package substrate 12 has a rectangular shape from a planar view, and its size is larger than a plane size of the semiconductor chip 44 (see FIG. 2A). The electrode pads 18, the wirings 20 and the lands 30 are formed by applying a conductive material such as a solder paste to the surface or the back surface of the core material 16 in a predetermined pattern. The surface-side terminals 36 are formed by metal such as copper (Cu). The solder resist 42 is formed by applying a heat-resistant resin material to the back surface of the core material 16.

The semiconductor chip 44 such as an LSI chip is mounted to a center portion of the package substrate 12. The back surface of the semiconductor chip 44 is bonded to the surface of the package substrate 12 by a die bond material 46. Plural electrodes, not shown, are formed on the surface of the semiconductor chip 44. Metal wirings 48 such as gold (Au) thin lines are bridged into a loop between the electrodes of the semiconductor chip 44 and the electrode pads 18, so that the semiconductor chip 44 is wire-bonded to the package substrate 12. That is to say, one ends of the metal wirings 48 are electrically connected to the electrodes of the semiconductor chip 44, and the other ends of the metal wirings 48 are electrically connected to the electrode pads 18.

The semiconductor chip 44 is sealed by a sealing resin layer 50. The sealing resin layer 50 is formed by a dispensing method or the like for naturally flowing liquid resin supplied from a dispenser on the substrate. Similarly, the electrode pads 18, the wirings 20 and the metal wirings 48 are sealed by the resin sealing layer 50. The end surfaces 36A of the surface-side terminals 36 are exposed from the surface of the sealing resin layer 50. In other words, the surface of the package substrate 12 is coated with the sealing resin layer 50 except for the end surfaces 36A.

The sealing resin layer 50 is formed on the package substrate 12 so that a height of its surface (so-called, "sealing height") becomes lower than the end surfaces 36A of the surface-side terminals 36. The "sealing height" is lower than the height of the surface-side terminals 36, but upper side surfaces of the surface-side terminals 36 close to the end surfaces 36A are also sealed by the sealing resin layer 50. This is because when the supplied liquid resin naturally flows and spreads, it creeps up the side surfaces of the surface-side terminals 36 where an irregularly-shaped portion is formed due to surface tension, and the sealing resin layer 50 is formed also on the side surfaces of the surface-side terminals 36.

At a conventional sealing step of forming a sealing resin layer according to the transfer molding method, sealing resin is injected and filled into a mold die and is molded so as to cover the surface-side terminals 36, and the molded sealing resin is ground so that the end surfaces 36A of the surface-side terminals 36 should be exposed from the sealing resin layer 50. On the contrary, in the first exemplary embodiment, the liquid resin is allowed to naturally flow so that the sealing resin layer 50 is formed. As a result, "a molding step" and "a grinding step" will be omitted, and thus the sealing step can be simplified more greatly than the case where resin sealing is carried out by the transfer molding method. The sealing resin layer 50 may be thinner, and thus a radiation property becomes high.

The liquid resin for sealing semiconductor includes various types of solvent/solventless, thermosetting/thermoplastic, one-component/two-component resins. Various kinds of the liquid resins include epoxy resin, phenol resin, silicone resin and polyimide resin. In general, thermosetting epoxy resin is used widely. From a viewpoint of fluidity, thixotropic epoxy resin is preferable. From a viewpoint of a mechanical property, epoxy resin including additive such as silicone is preferable. In the first exemplary embodiment, epoxy resin such as "CEL-C-3720" manufactured by Hitachi Chemical Co., Ltd. may be used as the liquid resin.

Rewiring pads and wirings may be formed as external connection terminals for connecting to another double-sided electrode package to be laminated on the upper side on the surface of the sealing resin layer 50. When the rewiring pads are arranged (rewired) on the surface of the sealing resin layer 50 in any layout, the connection to the package to be laminated on the upper side becomes very easy.

Figure 2A:
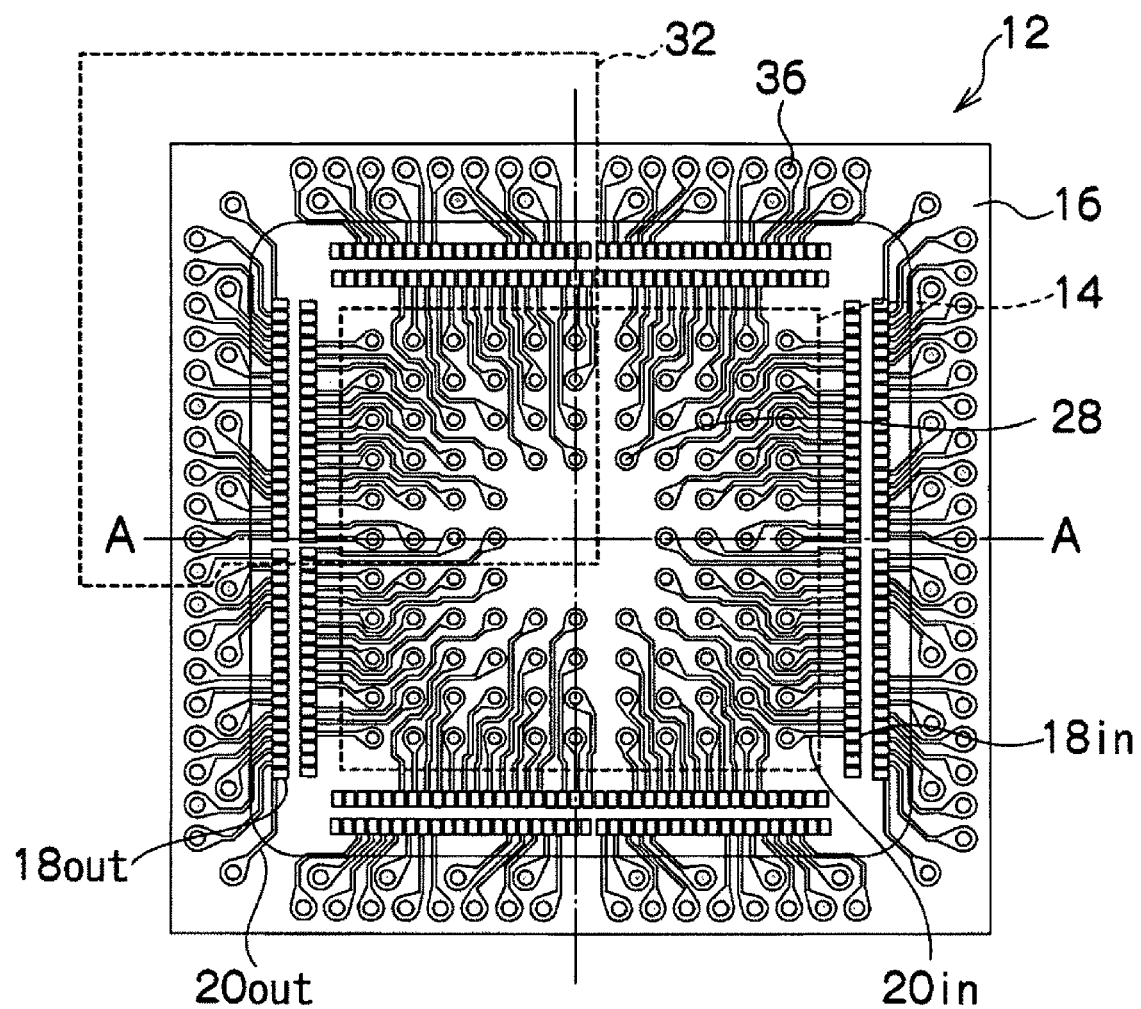
FIG. 2A is a plan view where a package substrate before mounting of a semiconductor chip is viewed from a surface side.
Figure 2B:
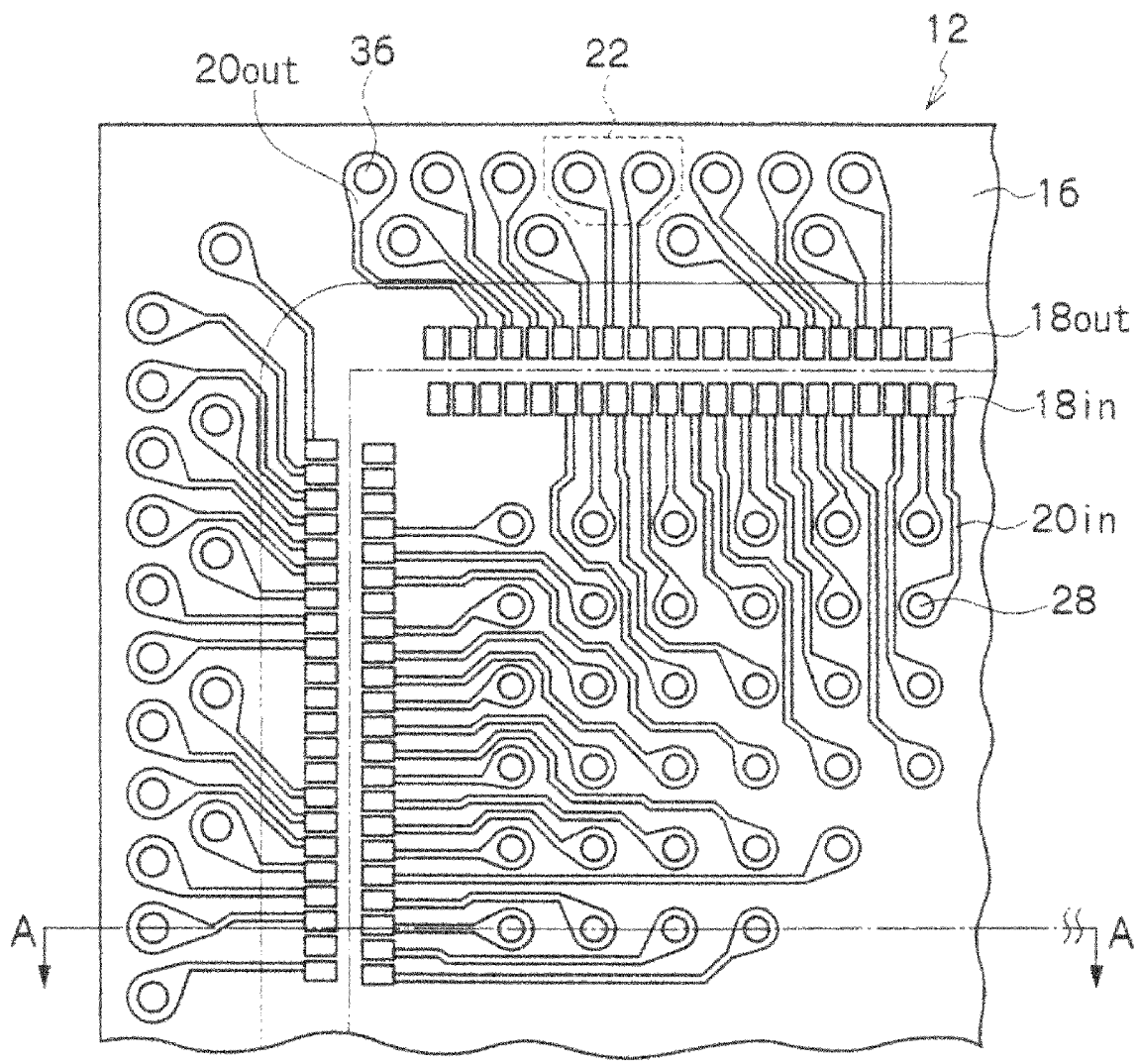
FIG. 2B illustrates a state of an region which is about ¼ of the surface of the package substrate in FIG. 2A.

FIG. 2A is a plan view when the package substrate 12 before mounting of the semiconductor chip 44 is viewed from the surface side. FIG. 2B illustrates a state of a region 32 which is about ¼ of the surface of the rectangular package substrate 12 in FIG. 2A. In the first exemplary embodiment, the size of the package substrate 12 is 13 mm×13 mm. FIG. 1 corresponds to the cross-sectional view taken along line A-A of FIGS. 2A and 2B.

As shown in FIGS. 2A and 2B, the end surfaces of the penetrating electrodes 28 are exposed from a chip arrangement region 14 (a region surrounded by a dotted line in FIG. 2A) where the semiconductor chip 44 of the package substrate 12 is arranged. In the first exemplary embodiment, 114 penetrating electrodes 28 are arranged at the center portion of the package substrate 12 into a matrix pattern of 11 by 11 with a several penetrating electrodes 28 omitted at the center. Further, 106 penetrating electrodes 28 are arranged at a periphery of the package substrate 12 so as to be opposed to the surface-side terminals 36 via the wirings 20.

156 inside electrode pads $18_{in}$ are arranged on the outside of the chip arrangement region 14 on the package substrate 12 so as to surround the chip arrangement region 14 in a square, with 39 of the inside electrode pads $18_{in}$ arranged on each side. 160 outside electrode pads $18_{out}$ are arranged on the outside of the inside electrode pads $18_{in}$ so as to surround the chip arrangement region 14 in a square, with 40 of the outside electrode pads $18_{out}$ arranged on each side. In the first exemplary embodiment, the size of the package substrate 12 is 13 mm by 13 mm, and the inside electrode pads $18_{in}$ are arranged on the inside of a virtual line (alternate long and short dash line in FIG. 2B) which is about 2 mm to the inner side of the outer periphery of the package substrate 12. The outside electrode pads $18_{out}$ are arranged outside the virtual line.

That is, the plural electrode pads 18 are arranged in two rows, i.e., an inside row and an outside row. As shown in the drawing, the inside electrode pads $18_{in}$ and the outside electrode pads $18_{out}$ are arranged into a zigzag pattern so that the outside electrode pad $18_{out}$ is opposed to a portion between the adjacent two inside electrode pads $18_{in}$. When the plural electrode pads 18 are arranged into plural rows and the zigzag pattern, the wiring becomes easy and the number of the electrode pads 18 to be arranged may be increased.

106 surface-side terminals 36 are arranged on the outsides of the electrode pads 18 on the package substrate 12 so as to surround the electrode pads 18 and the chip arrangement region 14 in a square. In the first exemplary embodiment, the size of the package substrate 12 is 13 mm by 13 mm, and the plural surface-side terminals 36 are arranged within a range of about 1.3 m from the outer periphery of the package substrate 12.

In the first exemplary embodiment, 29 or 24 surface-side terminals 36 are arranged on each side of the rectangular package substrate 12. In a region where the 29 surface-side terminals 36 are arranged in two rows, 8 surface-side terminals 36 are arranged on the inside and 21 surface-side terminals 36 are arranged on the outside. On the region where the 24 surface-side terminals 36 are arranged in two rows, 8 surface-side terminals 36 are arranged on the inside, and the 16 terminal 36 are arranged on the outside.

When partially viewed, the surface-side terminals 36 are arranged into a zigzag pattern so that the inside surface-side terminal 36 is opposed to a portion between the adjacent two outside surface-side terminals 36. Similarly to the electrode pads 18, the plural surface-side terminals 36 are arranged in plural rows or into the zigzag pattern, so that the wiring may be made to be easy and the number of the surface-side terminals 36 to be arranged may be increased.

The inside wirings $20_{in}$ are provided on the surface of the package substrate 12 suitably into a predetermined pattern so that one ends of the penetrating electrodes 28 and the inside electrode pads $18_{in}$ are connected on one-to-one. The outside wirings $20_{out}$ are provided suitably into a predetermined pattern so that one ends of the surface-side terminals 36 and the outside electrode pads $18_{out}$ are connected on one-to-one. In the first exemplary embodiment, 114 inside wirings $20_{in}$ are provided correspondingly to 114 penetrating electrodes 28. The 106 outside wirings $20_{out}$ are provided correspondingly to the 106 surface-side terminals 36.

FIGS. 2A and 2B illustrate only one example of the layout on the package substrate 12. The number and arrangement of the electrode pads 18, the wirings 20, the penetrating electrodes 28 and the surface-side terminals 36 on the package substrate 12 may be suitably changed according to the number of electrodes (pins) of the semiconductor chip 44, the size of the semiconductor chip 44 and the like. In the invention, since the adhesion between the surface-side terminals 36 and the sealing resin is satisfactory, the number of the surface-side terminals 36 is increased, so that the surface-side terminals 36 and the sealing resin layer 50 may be bonded more firmly.

FIG. 3 is a perspective view illustrating the shape of the surface-side terminals 36. FIG. 3 is a perspective view when the two surface-side terminals 36 present in the region 22 surrounded by the dotted line of FIG. 2B are viewed from an obliquely upward direction. The end portion of the outside wiring $20_{out}$ is formed into a drop pattern which is size larger than the cross section (approximately circular) of the surface-side terminal 36. Each of the pillar-shaped (post-shaped) surface-side terminal 36 stands on the drop-shaped end portion of the wiring 20 approximately vertically. Each of the surface-side terminals 36 has plural protruded rims formed over the entire periphery of its side surface along the peripheral direction (convex portions which continue in the peripheral direction).

In the first exemplary embodiment, each of the surface-side terminals 36 has three protruded rims. An undulating irregularly-shaped portion is formed by the plural protruded rims on the side surfaces of the pillar-shaped surface-side terminals 36. Flat top portions of the surface-side terminals 36 are exposed as the end surfaces 36A (see FIG. 4), described later, from the sealing resin layer 50.

Circumferences of the surface-side terminals 36 are filled with the sealing resin, but since the surface-side terminals 36 have the irregularly-shaped portion on their side surface, the adhesion with the sealing resin is noticeably improved. For this reason, the surface-side terminals 36 and the sealing resin layer 50 are hardly peeled from each other, so that the moisture-resistant reliability of the double-sided electrode package 10 is noticeably improved. The noticeable improvement of the adhesion with the sealing resin means that environmental temperature to which the both-sided electrode package 10 is exposed changes, and even when the metal-made surface-side terminals 36 expand and contract, the sealing resin layer 50 follows this state. For this reason, a fear that the electric connection becomes difficult due to warpage reduces, and the connection reliability to a package to be laminated on the upper portion is noticeably improved.

The height of the surface-side terminals 36 may be about 0.1 mm to 0.3 mm. In general, the thickness of the semiconductor chip 44 is about 50 μm to 100 μm. The height of the surface-side terminals 36 is preferably about 2 to 3 times as large as the thickness of the semiconductor chip 44. In the first exemplary embodiment, the height of the surface-side terminals 36 is 256 μm.

Figure 4:
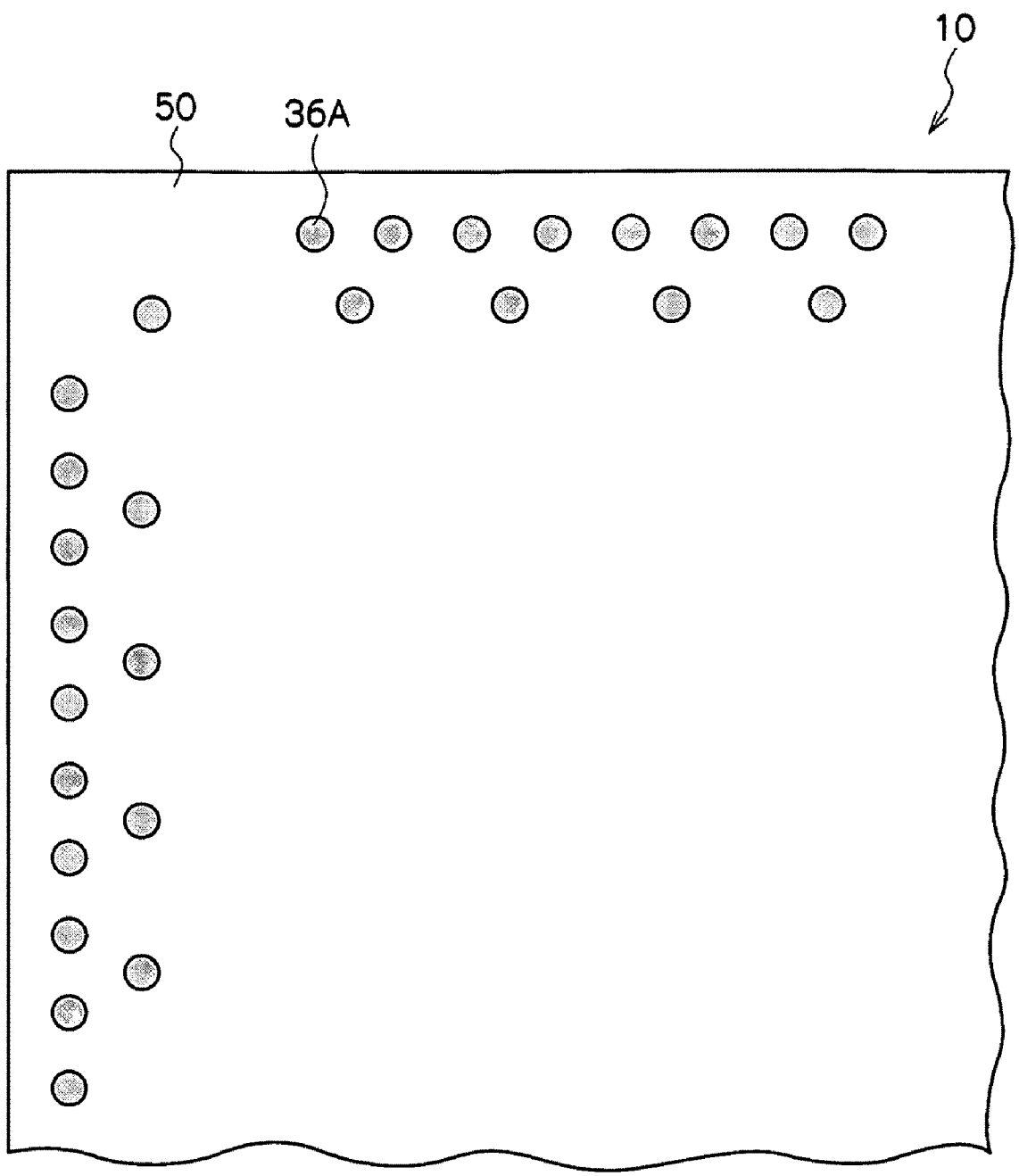
FIG. 4 is a partial plan view where the double-sided electrode package is viewed from the surface side.

FIG. 4 is a partial plan view when the both-sided electrode package 10 is viewed from the surface side. FIG. 4 illustrates the state of the region which is about ¼ of the surface of the both-sided package 10 correspondingly to FIG. 2B. As described with reference to FIG. 1, the surface of the package substrate 12 to which the semiconductor chip 44 is mounted is coated with the sealing resin layer 50 except for the end surfaces 36A of the surface-side terminals 36. Only the end surfaces 36A of the surface-side terminals 36 are exposed from the surface of the sealing resin layer 50.

In the first exemplary embodiment, 106 surface-side terminals 36 are arranged. Since the pillar-shaped surface-side terminals 36 stand on the package substrate 12 approximately vertically, the end surfaces 36A of the surface-side terminals 36 are exposed from the positions which correspond to the surface-side terminals 36. In the first exemplary embodiment, 106 end surfaces 36A are exposed from the surface of the both-sided electrode package 10.

[Method for Manufacturing the Both-Sided Electrode Package]

A method for manufacturing the both-sided electrode package 10 is described below.

Figure 5:
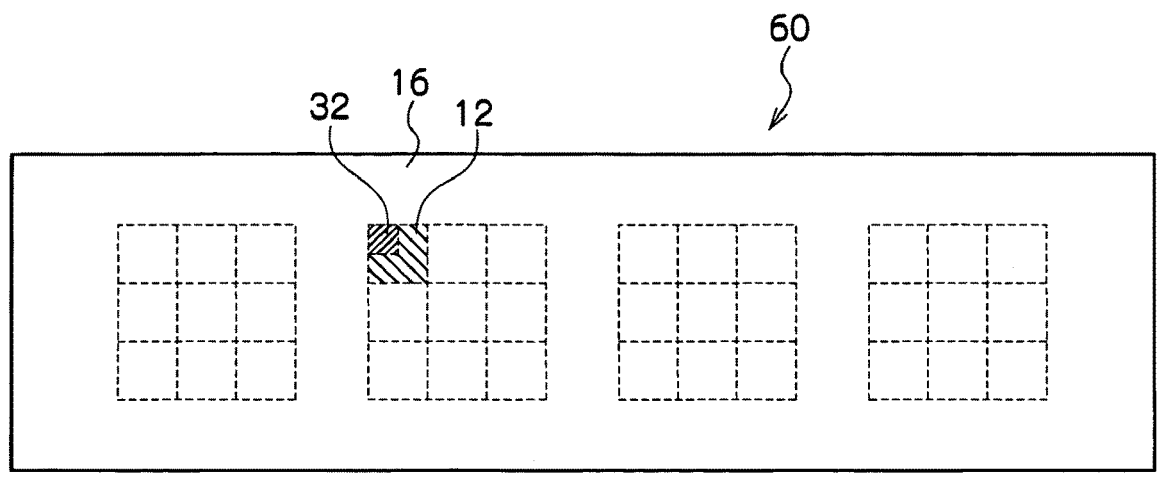
FIG. 5 is a plan view illustrating a manufacturing step according to the first exemplary embodiment when an entire substrate frame is viewed from a surface side.

FIGS. 5 to 10 are diagrams illustrating manufacturing steps for the both-sided electrode package 10 according to the first exemplary embodiment. At the manufacturing steps, as shown in FIG. 5, a single substrate frame 60 on which the plural package substrates 12 is formed is used. The structure of the both-sided electrode package is formed for each package substrate on the substrate frame 60. Finally, the substrate frame 60 is diced so as to divide (separate) the substrate frame into the individual both-sided electrode packages. The manufacturing steps for the both-sided electrode package 10 are described sequentially.

(Step of Preparing the Substrate Frame)

The single substrate frame 60 which is formed with the plural package substrates 12 is prepared. FIGS. 5, 6 and 7 are diagrams illustrating the preparing steps for the substrate frame 60. FIG. 5 is a plan view when the entire substrate frame 60 is viewed from the surface side. FIG. 6 is a partial cross-sectional view of the substrate frame 60.

The long substrate frame 60 is formed with the plural package substrates 12. As shown in FIG. 5, the 36 package substrates 12 are arranged on the substrate frame 60. 36 package substrates 12 are divided into four groups, and each group is composed of the 9 package substrates 12. In one group, 9 package substrates 12 are arranged into a matrix pattern of 3 by 3. The respective groups are arranged along the lengthwise direction of the substrate frame 60 at predetermined intervals. FIG. 2B illustrates only a region 32 which is about ¼ of the upper left of the package substrate 12 of the drawing.

FIG. 6 illustrates only a portion including 2 package substrates 12. In the drawing, the portion surrounded by the dotted line corresponds to the 1 package substrate 12 shown in FIGS. 1 and 2. The substrate frame 60 has the flat plate-shaped core material 16. The plural electrode pads 18, the plural wirings 20, the plural penetrating electrodes 28, the plural lands 30, the plural surface-side terminals 36 and the solder resist 42 are formed on each package substrate 12 on the core material 16.

The core material 16 and solder resist 42 are composed of insulators. Organic resin or the like is preferable as the insulator. The solder resist 42 is formed by applying heat-resistant resin to the back surface of the core material 16. The surface-side terminals 36 are formed after the electrode pads 18, the wirings 20, the penetrating electrodes 28, the lands 30 and the solder resist 42 are formed on the core material 16. The method for manufacturing the surface-side terminals 36 is described in detail later.

The conductive materials 26 to be filled into the vias 24 of the electrode pads 18, the wirings 20 and the penetrating electrodes 28, and the lands 30 are naturally composed of conductive materials. The electrode pads 18, the wirings 20 and the lands 30 are formed by applying a conductive material such as solder paste to the surface or the back surface of the core material 16 into a predetermined pattern. A material with low electric resistance is preferable as the conductive material.

As described later, after the electrode pads 18 and the wirings 20 are formed, the surface-side terminals 36 made of metal are formed by etching. For this reason, a conductive material which is insoluble in an etching liquid is preferably used as the electrode pads 18 and the wirings 20. In the first exemplary embodiment, since the surface-side terminals 36 made of copper are formed, a conductive material insoluble in an aqueous ferric chloride as the etching liquid is preferably used as the electrode pads 18 and the wirings 20. For example, tin lead (SnPb) which is widely used as the solder paste may be used.

FIGS. 7A to 7F are diagrams illustrating steps of forming the surface-side terminal 36 on each package substrate. These steps are composed of three-stage wet etching step. The plural surface-side terminals 36 is formed on each package substrate, but FIGS. 7A to 7F illustrate states that one surface-side terminal 36 is formed.

Figure 7A:
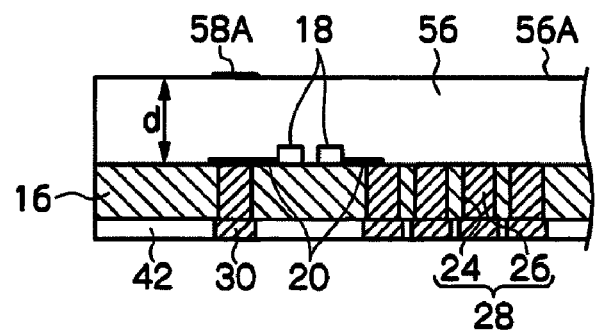
FIGS. 7A to 7F are diagrams illustrating manufacturing steps according to the first exemplary embodiment and particularly illustrating the steps of forming the surface-side terminal on the package substrate sequentially.

As shown in FIG. 7A, a copper foil 56 with thickness d is pasted to the surface of the core material 16 on which the electrode pads 18, the wirings 20, the penetrating electrodes 28, the lands 30 and the solder resist 42 are formed. The thickness d of the copper foil 56 may be 0.1 mm to 0.3 mm. Plural masks 58A for etching are formed on a surface 56A of the copper foil 56 so that the plural pillar-shaped surface-side terminals 36 are formed. The respective masks 58A are formed into a predetermined pattern on positions opposed to the drop-shaped end portions of the wirings 20 formed on the surface of the core material 16. In the first exemplary embodiment, the plural small circular masks 58A are formed according to the diameters of the pillar-shaped surface-side terminals 36.

Figure 7B:
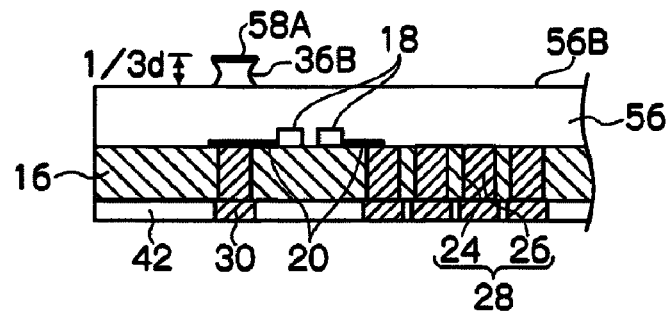

As shown in FIG. 7B, the copper foil 56 is etched from the surface 56A to a depth of about ⅓ d by using the masks 58A. In the etching of the copper foil 56, aqueous ferric chloride is used as the etching liquid. In the wet etching, a dipping method or a spinning method may be used. When the copper foil 56 is etched to the depth of about ⅓ d, the pillar-shaped copper foil (Cu post) with height of about ⅓ d remains below the masks 58A. Further, the other portions of the copper foil 56 are removed by the same depth, so that a new surface 56B of the copper foil 56 is exposed. Since the wet etching progresses isotropically, the copper foil 56 is side-etched to portions below the masks 58A. For this reason, the Cu posts do not have a typical pillar shape, and a continuous concave portion (narrowed portion) is formed on side surface 36B in a peripheral direction.

Figure 7C:
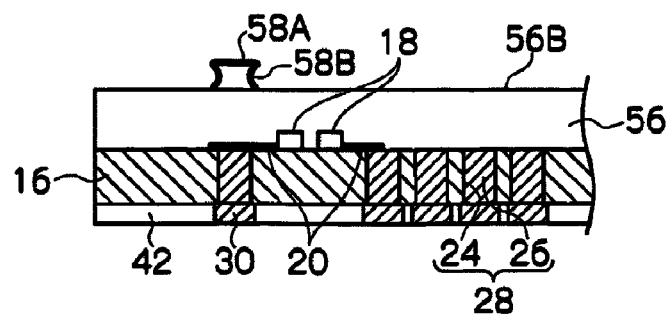
Figure 7D:
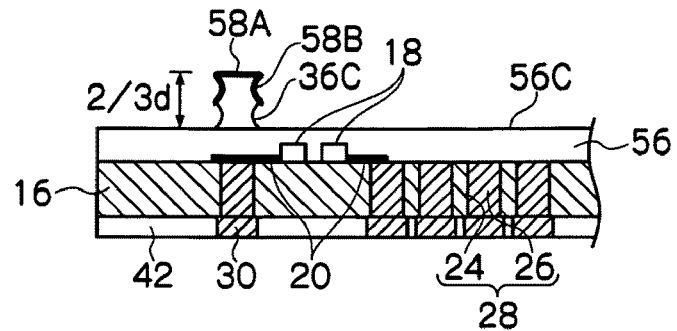

As shown in FIG. 7C, the mask 58B is formed on the side surface 36B of each Cu post with the mask 58A at the top of each Cu post remaining. As shown in FIG. 7D, the copper foil 56 is etched to a depth of about ⅔ d from the surface 56A by using the masks 58A and 58B. When the copper foil 56 is etched to the depth of about ⅔ d, the pillar-shaped copper foil (Cu post) remains below the each mask 58A, and the other portions of the copper foil 56 are removed by the same depth, so that a new surface 56C of the copper foil 56 is exposed. Also the Cu post newly formed is side-etched, and a continuous concave portion is formed on its side surface 36C in the peripheral direction.

Figure 7E:
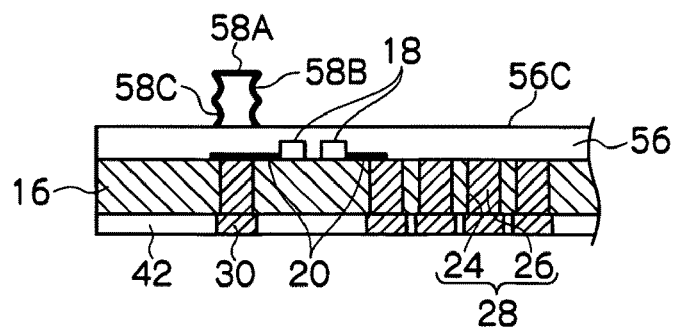
Figure 7F:
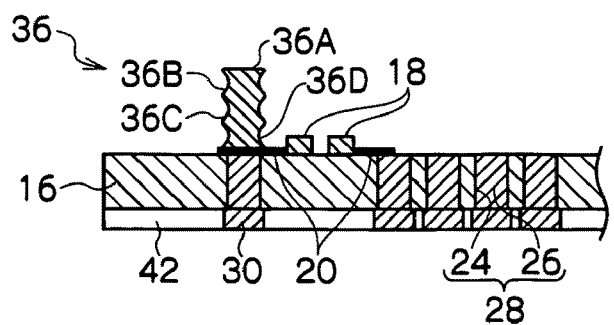

As shown in FIG. 7E, a mask 58C is formed on each side surface 36C of each Cu post with the mask 58A at the top and the mask 58B on the side surface of each Cu post remaining. As shown in FIG. 7F, the copper foil 56 is etched by using the masks 58A, 58B and 58C until the surface of the core material 16 is exposed.

When the copper foil 56 is etched until the surface of the core material 16 is exposed, the pillar-shaped copper foil (Cu post) remains below the mask 58A, and the other portions of the copper foils are removed. As a result, the end surfaces of the electrode pads 18, the wirings 20 and the penetrating electrodes 28 formed on the surface of the core material 16 as well as the core material 16 are exposed. The newly formed Cu post is side-etched, so that a continuous concave portion is formed on its side surface 36D in the peripheral direction. Finally, when the masks 58A, 58B and 58C are removed, the cylindrical surface-side terminal 36 where the end surface 36A is flat and the irregularly-shaped portion is formed on the side surface is completed.

The side surfaces 36B, 36C and 36D formed with the continuous concave portion in the peripheral direction are formed on the side surface of the completed surface-side terminal 36 in this order from the top. For this reason, protruded rims (continuous convex portions in the peripheral direction) are formed between the side surface 36B and the side surface 36C. Protruded rims are similarly formed also between the end surface 36A and the side surface 36B and between the side surface 36C and the side surface 36D.

When the copper foil 56 is wet-etched at plural times, the surface-side terminal 36 having the protruded rims whose number accords with the number of etching times may be obtained. In the first exemplary embodiment, the copper foil 56 is wet-etched at three stages, so that the surface-side terminal 36 having three protruded rims on its side surface is obtained. In the first exemplary embodiment, the side surfaces 36B, 36C and 36D have the approximately same shape in a manner that three-time etching is carried out under the similar condition.

The number of protruded rims is not limited to three, and may be two or four or more. As the number of protruded rims increases, the number of times of etching increases, and thus the manufacturing steps become complicated, but the adhesion with the sealing resin is improved. As the shape of the protruded rims, a shape such that a cross section at the time of cutting along a cylindrical rotating axis is an approximately triangle shape with sharp point is considered, but its top may have a flat shape. The height of the surface-side terminal 36 may be 0.1 mm to 0.3 mm as described above. A diameter of a thickest portion of the surface-side terminal 36 (diameter of the convex portion) is preferably about 0.5 to 1.0 time the height of the surface-side terminal 36, and may be about 0.05 mm to 0.3 mm.

The diameter of the concave portion of the surface-side terminal 36 is preferably about 80% of the diameter of the convex portion. For example, when the diameter of the convex portion of the surface-side terminal 36 is 0.15 mm, the diameter of the concave portion may be 0.12 mm. As the height of the protruded rim becomes higher, setting of etching conditions becomes more difficult, but the adhesion with the sealing resin is improved. The diameter of the cylindrical surface-side terminal 36 is a diameter of the cut surface at the time of cutting the surface-side terminal 36 along a surface parallel with the package substrate 12 (core material 16). The cut surface of the cylindrical surface-side terminal 36 is circular, and the "diameter" means a diameter of the circle.

(Step of Arranging the Semiconductor Chip)

Figure 8:
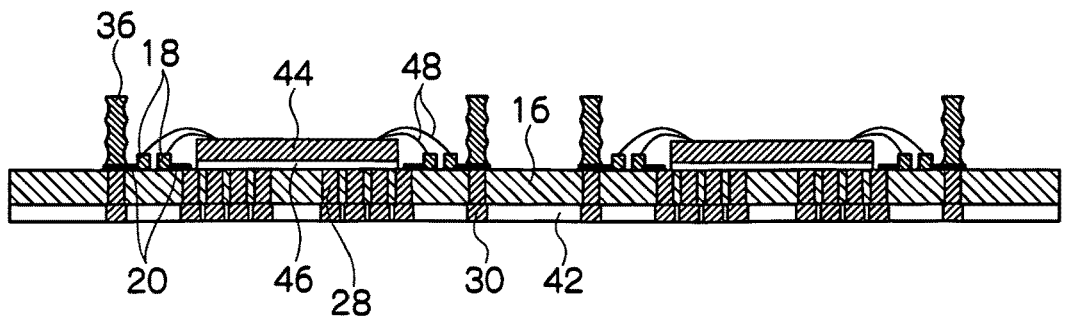
FIG. 8 is a diagram illustrating a manufacturing step according to the first exemplary embodiment and a partial cross-sectional view of the substrate frame illustrating a semiconductor chip arranging step.

The semiconductor chip 44 is arranged on the chip arrangement region 14 (see FIG. 2A) of each package substrate 12. FIG. 8 is a partial cross-sectional view of the substrate frame illustrating the step of arranging the semiconductor chip. The semiconductor chip 44 such as an IC chip or an LSI chip is manufactured by dividing (dicing) a semiconductor wafer formed with plural same circuits into individual circuits. Plural electrodes, not shown, are provided onto the surface of the semiconductor chip 44.

A die bond material 46 for fixing a chip is pasted to the chip arrangement region 14 at the center of the package substrate 12. The die bond material 46 is an insulating adhesive, and for example, an adhesive sheet may be used. The back surface of the semiconductor chip 44 is bonded to the package substrate 12 by using the die bond material 46. As a result, the semiconductor chip 44 is fixed to the surface of the package substrate 12. As shown in FIG. 5, the plural package substrates 12 are formed on the substrate frame 60. The semiconductor chip 44 is fixed to each of the package substrates 12.

The electrodes and the electrode pads 18 provided onto the surface of the semiconductor chip 44 are wire-bonded by the metal wirings 48 by using a bonding apparatus such as a wire bonder. Gold (Au) thin lines may be used as the metal wirings 48. As shown in FIG. 8, the metal wirings 48 are bridged into a loop between the semiconductor chip 44 and the electrode pads 18. At this time, the loop height of the metal wirings 48 is set to be lower than the height (sealing height) of the sealing resin layer 50 to be formed at the sealing step, described later.

(Step of Sealing the Semiconductor Chip)

Figure 9A:
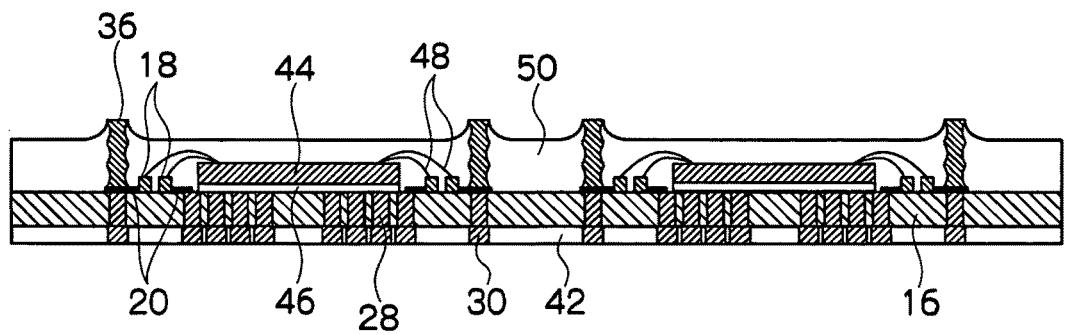
FIGS. 9A and 9B are diagrams illustrating manufacturing steps according to the first exemplary embodiment, and particularly the diagram illustrating a semiconductor chip sealing step.
Figure 9B:
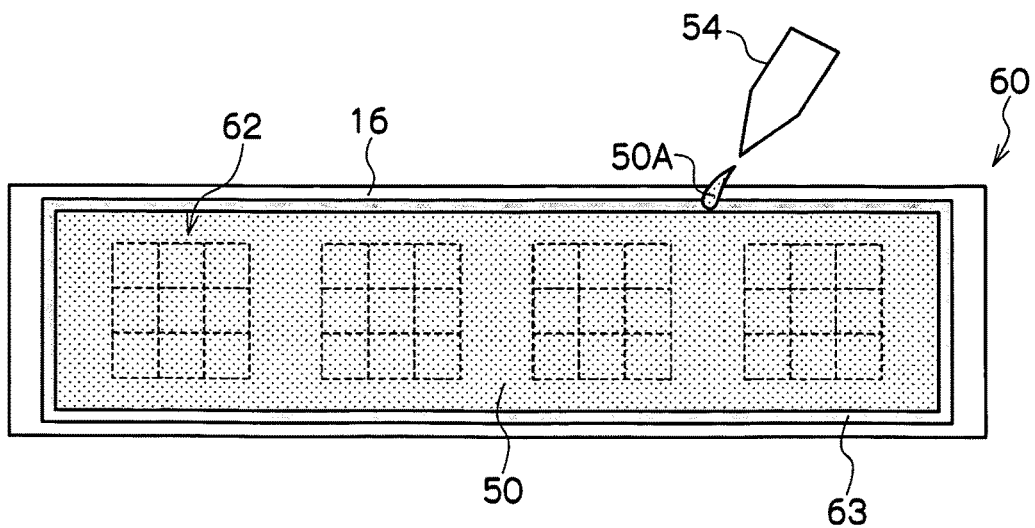

The semiconductor chip 44 is sealed by the sealing resin. FIGS. 9A and 9B are diagrams illustrating the sealing step for the semiconductor chip. FIG. 9A is a partial cross-sectional view of the substrate frame sealed by the resin, and FIG. 9B is a plan view when the resin-sealed substrate frame is viewed from the surface side.

The sealing using the sealing resin is carried out by the dispensing method for naturally flowing liquid resin supplied from a dispenser on the substrate. As shown in FIG. 9B, a resin dam 63 as a "partitioning member" for holding back the liquid resin is formed on the surface of the substrate frame 60 where the semiconductor chips 44 are arranged. The resin dam 63 can be formed by applying curable resin such as epoxy resin which is the same as the sealing resin and curing it.

Plural (in this example, four) regions 62 (shown by a dotted line) formed with the plural package substrates 12 are arranged on the substrate frame 60. The resin dam 63 is formed into a frame shape on the outside of the regions 62 so as to surround them. The height of the resin dam 63 is the approximately same as the height of the sealing resin layer 50 (sealing height). In the first exemplary embodiment, the height of the surface-side terminals 36 is 256 μm, and the height of the resin dam 63 (namely, the sealing height) is 180 μm to 220 μm.

Liquid resin 50A is supplied from a dispenser 54 to the regions 62 formed with the package substrates 12 in the substrate frame 60. The supplied liquid resin 50A naturally flows on the substrate frame 60 so as to uniformly spread and is held back by the resin dam 63. As a result, the region surrounded by the resin dam 63, namely, the region which is wider than the regions 62 where the package substrates 12 are formed is coated with the liquid resin 50A up to the approximately same height as that of the resin dam 63.

After the coating, the liquid resin 50A is cured so as to be the sealing resin layer 50, and the sealing step for the semiconductor chips 44 is ended. The region wider than the regions 62 is coated with the liquid resin 50A, so that the semiconductor chips 44 arranged on the respective chip arrangement regions 14 are sealed collectively. The liquid resin 50A intrudes the gaps between the semiconductor chips 44 and the substrate frame 60, and the electrode pads 18, the wirings 20 and the metal wirings 48 as well as the semiconductor chip 44 are sealed.

In the first exemplary embodiment, when the liquid resin is naturally flowed so as to form the sealing resin layer 50, "the molding step" and "the grinding step" may be omitted. As a result, the sealing step may be simplified more greatly than the case of the resin sealing in the transfer molding method. Since the liquid resin naturally flows and uniformly spreads, the formation of the thin sealing resin layer 50 becomes easier than the transfer molding method and a method including transfer and grinding. The surface of the substrate frame 60 is uniformly coated with the sealing resin layer 50 except for the end surfaces 36A of the surface-side terminals 36. Therefore, peeling of the resin occur more easily than the case where the surface of the substrate frame 60 is coated with plural kinds of resins with different coefficients of thermal expansion and coefficients of thermal contraction.

Rewiring can be carried out on the surface of the sealing resin layer 50. For example, rewiring pads and wirings are formed into a predetermined rewiring pattern on the surface of the sealing resin layer 50 by metal nanoparticles such as copper nanoparticles. The rewiring pattern may be formed by inkjet print using ink containing the metal nanoparticles or screen print using paste including the metal nanoparticles. When the ink or the paste containing the metal nanoparticles is used, after the rewiring pattern is formed, reduction using atomic hydrogen is carried out so that blot or oxide due to organic solvent is removed.

(Dicing Step)

Finally, the substrate frame 60 is diced so as to separate individual packages.

Figure 10A:
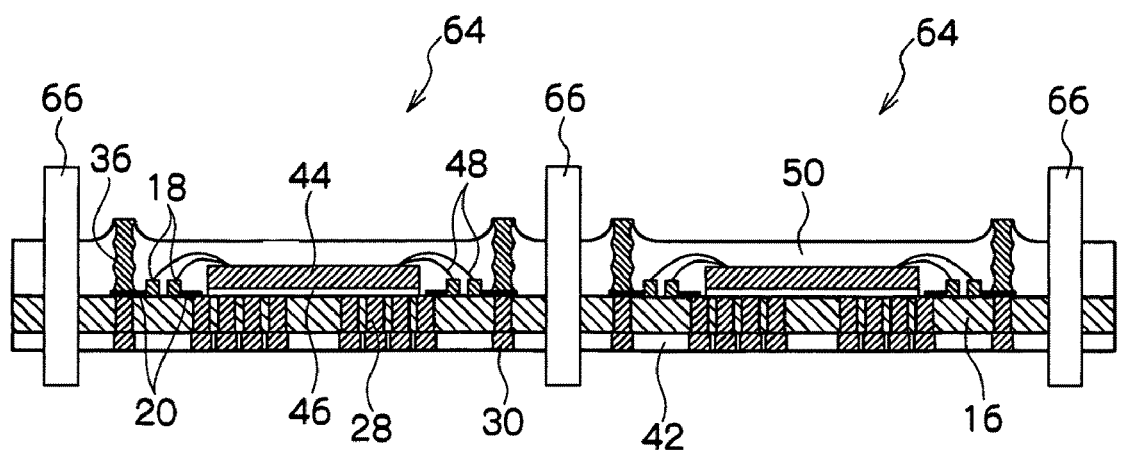
FIGS. 10A and 10B are diagrams illustrating manufacturing steps according to the first exemplary embodiment, and particularly the diagram illustrating dicing step.
Figure 10B:
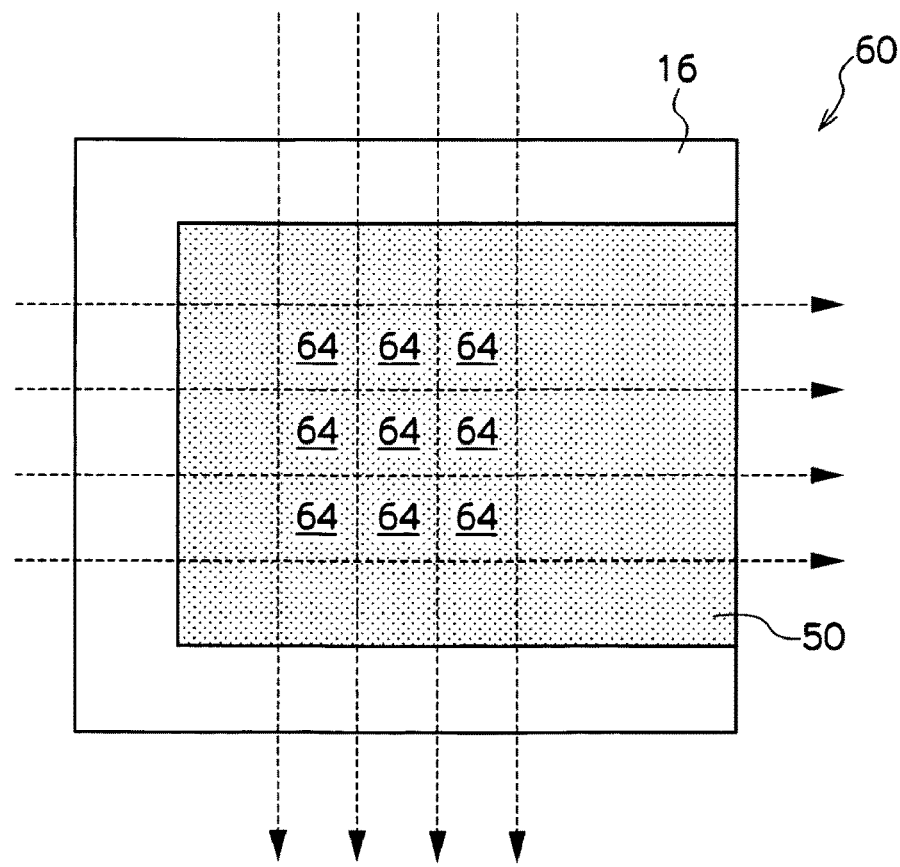

FIGS. 10A and 10B are diagrams illustrating the dicing step. FIG. 10A is a partial cross-sectional view of the substrate frame at the time of dicing, and FIG. 10B is a plan view when the substrate frame is viewed from the surface side at the time of dicing. The plan view of FIG. 10B illustrates a part of the substrate frame 60 corresponding to 1 set (9 pieces) of the package substrates 12.

Plural package structures 64 are formed on the substrate frame 60. In the example shown in FIG. 10B, 9 double-sided electrode package structures 64 are arranged on the portion of the substrate frame 60 shown in the drawing into a matrix pattern of 3 by 3. A blade, not shown, is moved to an arrow direction, and the substrate frame 60 is saw-cut into a grid pattern so as to separate the individual both-sided electrode package structures 64. The substrate frame 60 on blade passing regions 66 is cut off by the saw-cutting. A diamond blade or the like may be used as the blade. The individual both-sided electrode package structures 64 are separated in such a manner, so that the both-sided electrode package 10 is completed.

The both-sided electrode package 10 manufactured in the first exemplary embodiment has a simple constitution such that the sealing resin layer 50 is formed so as to fill the peripheries of the surface-side terminals 36 formed on the package substrate 12. For this reason, the double-sided electrode package 10 may be manufactured simply and inexpensively without carrying out complicated working such as counter boring of the package substrate and laser machining of a lot of through holes.

In the first exemplary embodiment, since the liquid resin is naturally flowed so as to form the sealing resin layer 50, "the molding step" and "the grinding step" may be omitted. As a result, the sealing step may be simplified more greatly than the case where the resin sealing is carried out by the transfer molding method. Therefore, the double-sided electrode packages 10 may be manufactured more simply and inexpensively. Further, since the liquid resin is naturally flowed so as to form the sealing resin layer 50, the thin sealing resin layer 50 can be formed more easily than the transfer molding method and a method including transfer and grinding without using advanced manufacturing techniques.

Since the double-sided electrode package 10 manufactured in the first exemplary embodiment has the simple structure and the following characteristics, it produces an effect such that the connection reliability and moisture-resistant reliability with respect to another package are excellent.

(1) In the double-sided electrode package 10, the peripheries of the surface-side terminals 36 are filled with the sealing resin, but since the surface-side terminals 36 have the protruded rims on their side surfaces, the adhesion with the sealing resin is remarkably improved by the anchor effect. For this reason, the surface-side terminals 36 and the sealing resin layer 50 are hardly peeled from each other, so that the moisture-resistant reliability of the double-sided electrode package 10 is noticeably improved. The noticeable improvement of the adhesion with the sealing resin means that even when ambient temperature to which the double-sided electrode package 10 is exposed changes and the metal-made surface-side terminals 36 are expanded and contracted, the sealing resin layer 50 follows this state. For this reason, the fear that the electric connection becomes difficult due to warpage is reduced, and the connection reliability with a package to be laminated on an upper portion is noticeably improved.

(2) Since the metal-made surface-side terminals 36 are formed on the package substrate 12 by etching the laminated copper foil, a portion where thermal warpage concentrates is not present. For this reason, durability with respect to a change in the ambient temperature is higher than the case where metal terminals are formed by solder.

(3) The surface of the double-sided electrode package 10 is coated with one kind of sealing resin layer 50, and thus the peeling of the resin hardly occur, and the moisture-resistant reliability is higher than the case where a surface is coated with plural kinds of resins with different coefficients of thermal expansion and coefficients of thermal contraction. That is to say, the peeling of the resin due to heat of reflow (solder) at the time of packaging the substrate may be prevented. As a result, intrusion of moisture into the package and disconnection due to peeling of the rewiring pattern may be prevented.

(4) The electrode pads 18 and the surface-side terminals 36 are arranged in plural rows and into a zigzag pattern, so that the wiring is facilitated and the number of the electrode pads 18 and the surface-side terminals 36 to be arranged is increased. As a result, this structure may cope with the multi-pin structure of the semiconductor chip 44. Particularly when the number of the surface-side terminals 36 to be arranged is increased, the surface-side terminals 36 and the sealing resin layer 50 may be bonded more firmly.

Second Exemplary Embodiment

A second exemplary embodiment describes a method for manufacturing the double-sided electrode package in which semiconductor chips are mounted to a package substrate formed with plural surface-side terminals having plural protruded rims formed on entire peripheries of their side surfaces in a peripheral direction and the semiconductor chips are sealed by the liquid resin similarly to the first exemplary embodiment. In the second exemplary embodiment, the substrate frame on which plural package substrates is formed is used, and a "partitioning member" which holds back the liquid resin is formed on each package substrate on the substrate frame. After the semiconductor chips are arranged, the substrate frame is divided (separated) to form the individual package substrates. After the separation, resin sealing is carried out on each package substrate, so that the structure of the double-sided electrode package is formed. These manufacturing steps are described.

[Double-Sided Electrode Package]

Figure 11:
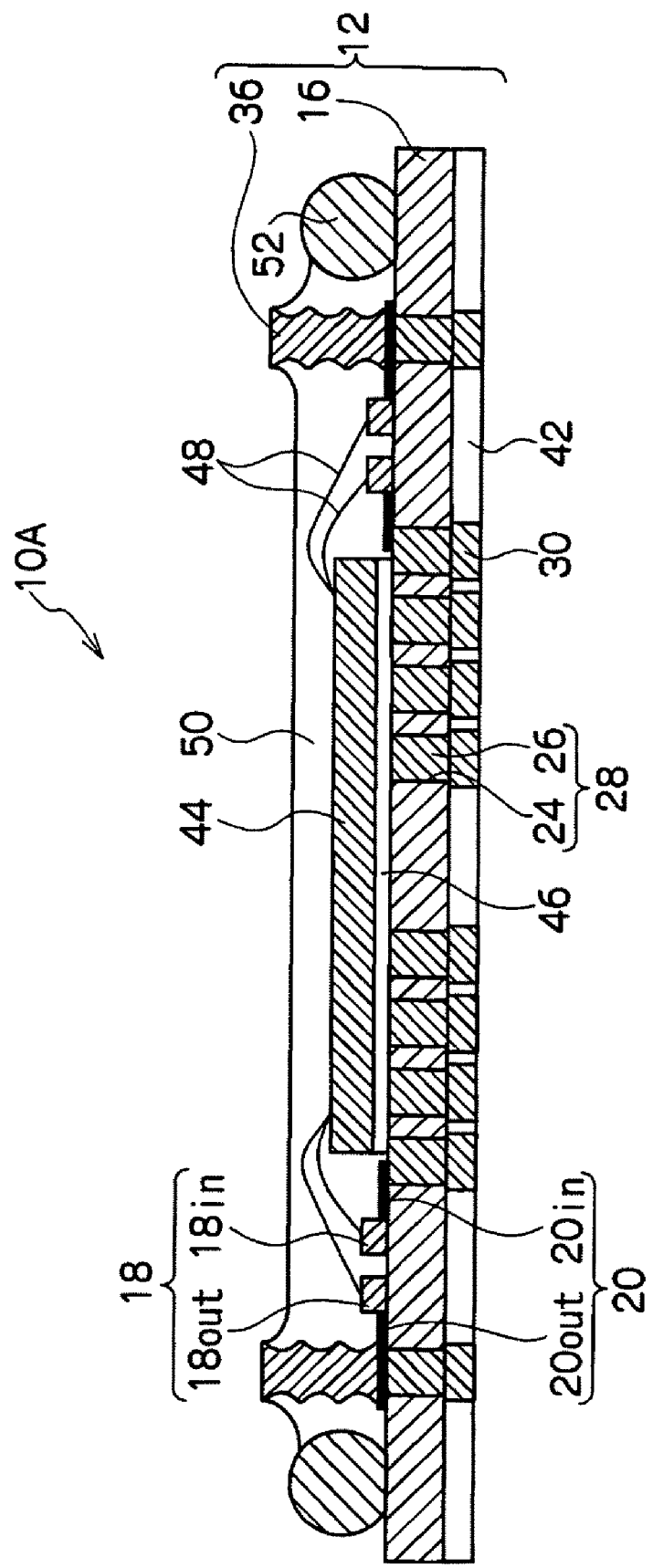
FIG. 11 is a schematic cross-sectional view illustrating a structure of the double-sided electrode package to be manufactured in a second exemplary embodiment of the invention.

FIG. 11 is a schematic cross-sectional view illustrating the structure of the double-sided electrode package to be manufactured in the second exemplary embodiment of the invention. The double-sided electrode package 10A has the same structure as that of the double-sided electrode package 10 in the first exemplary embodiment except that resin dam 52 as the "partitioning member" which holds back the liquid resin is formed so as to surround the plural surface-side terminals 36. For this reason, like members are denoted by like symbols, and the description thereof is omitted.

The sealing resin layer 50 is formed on the package substrate 12 so that the height of its surface (sealing height) becomes lower than the end surfaces 36A of the surface-side terminals 36 similarly to the first exemplary embodiment. The "sealing height" is lower than the height of the surface-side terminals 36. However the side surfaces of the surface-side terminals 36 are sealed by the sealing resin layer 50. The resin dam 52 is provided into a frame shape on the outsides of the plural surface-side terminals 36 so as to surround the plural surface-side terminals 36 arranged on the peripheral portion of the package substrate 12. The resin dam 52 may be formed by applying the curable liquid resin such as epoxy resin which is the same as the sealing resin and curing it. The height of the resin dam 52 is the approximately same as the height of the sealing resin layer 50 (sealing height). In the second exemplary embodiment, the height of the surface-side terminals 36 is 256 μm, and the height of the resin dam 52 (namely, the sealing height) is 180 μm to 220 μm.

Also in the second exemplary embodiment, similarly to the first exemplary embodiment, each of the surface-side terminals 36 has plural protruded rims. An undulating irregularly-shaped portion is formed on the side surfaces of the pillar-shaped surface-side terminals 36 by the plural protruded rims. When the side surfaces of the surface-side terminals 36 have the irregularly-shaped portion, the adhesion with the sealing resin is noticeably improved by the anchor effect. For this reason, the surface-side terminals 36 and the sealing resin layer 50 are hardly peeled from each other, and the moisture-resistant reliability of the double-sided electrode package 10A is noticeably improved. Further, even when the ambient temperature to which the double-sided electrode package 10A is exposed is changed and the metal-made surface-side terminals 36 expand and contract, the sealing resin layer 50 follow this state. For this reason, the reliability of the connection to a package to be laminated on an upper portion is noticeably improved.

[Method for Manufacturing the Double-Sided Electrode Package]

The method for manufacturing the double-sided electrode package 10A is described below. The double-sided electrode package 10A may be manufactured similarly to the double-sided electrode package 10 according to the first exemplary embodiment except that the resin dam 52 is formed on each package on the substrate frame 60 after the step of arranging the semiconductor chip, the individual package structures formed with the resin dams 52 are separated and the separated package structures are subject to the sealing step. For this reason, the description other than the different point will be omitted.

The semiconductor chips 44 are arranged on the chip arrangement regions 14 of the individual package substrate 12 on the substrate frame 60 similarly to the first exemplary embodiment up to the "the step of arranging the semiconductor chip" (see FIGS. 5 to 8).

(Step of Forming the Resin Dam)

The resin dam 52 is formed on each package substrate 12.

Figure 12A:
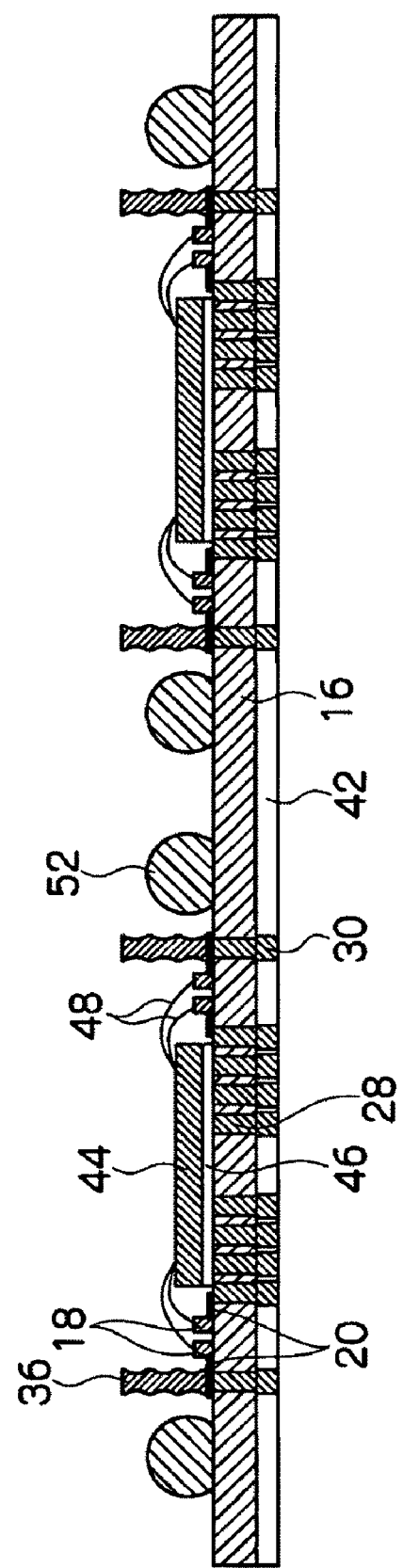
FIGS. 12A and 12B are diagrams illustrating manufacturing steps according to the second exemplary embodiment, and particularly the diagrams illustrating resin dam forming step.
Figure 12B:
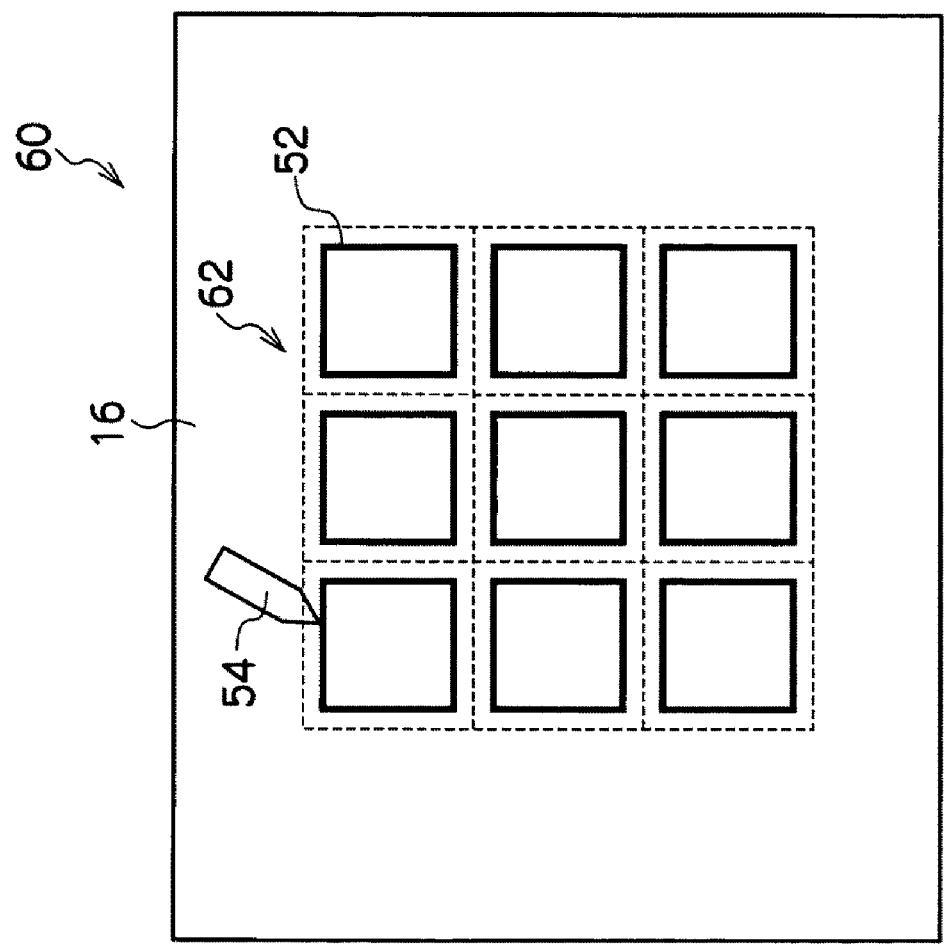

FIGS. 12A and 12B are diagrams illustrating the step of forming the resin dams. FIG. 12A is a partial cross-sectional view of the substrate frame formed with the resin dams, and FIG. 12B is a plan view when the substrate frame formed with the resin dams is viewed from the surface side.

As shown in FIGS. 12A and 12B, a region 62 (shown by a dotted line) where the plural package substrates 12 are formed is arranged on the substrate frame 60 (core material 16). As shown in FIG. 12B, the 9 package substrates 12 are arranged on the shown region 62 of the substrate frame 60 into a matrix pattern of 3'3. The plural surface-side terminals 36 are arranged on peripheral portions of the package substrates 12 in a square to surround the semiconductor chips 44.

Liquid resin 52A is supplied from the dispenser 54 onto the substrate frame 60, and the liquid resin 52A is applied to the outsides of the surface-side terminals 36 so as to surround the plural surface-side terminals 36 arranged in a square on each package substrate 12. The applied liquid resin 52A is cured, and the frame-shaped resin dam 52 is formed on each package substrate 12.

(Dicing Step)

The substrate frame 60 is diced to separate the respective package structures.

Figure 13A:
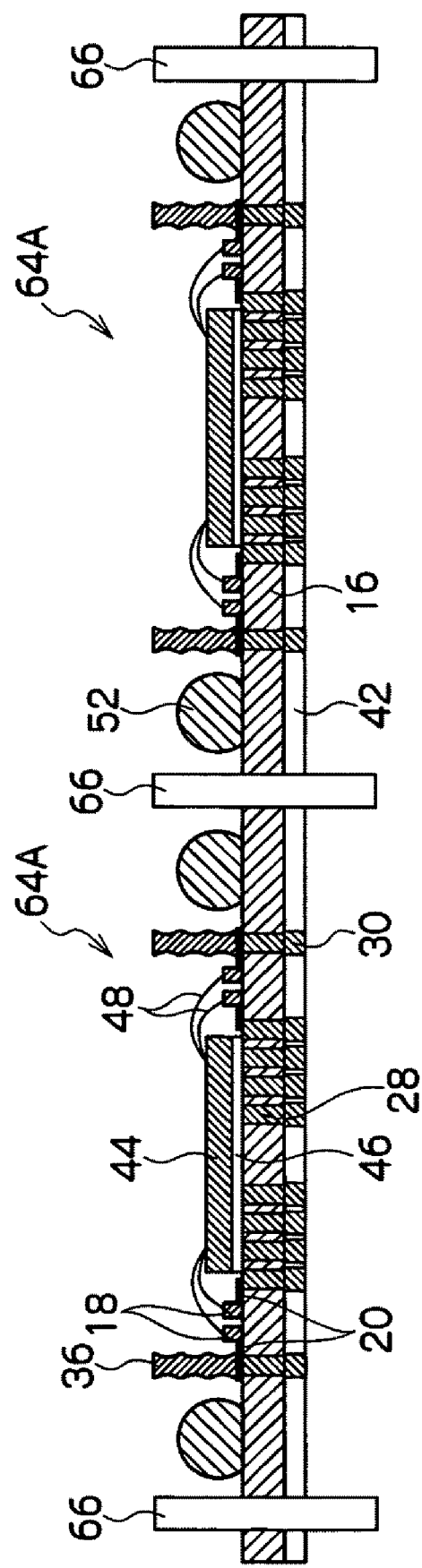

FIGS. 13A and 13B are diagrams illustrating the dicing step. FIG. 13A is a partial cross-sectional view illustrating the substrate frame at the time of dicing, and FIG. 13B is a plan view when the substrate frame at the time of dicing is viewed from the surface side.

Plural unsealed package structures 64A are formed on the substrate frame 60. In the second exemplary embodiment, as shown in FIG. 13B, the 9 package structures 64A are arranged on the shown portion of the substrate frame 60 into a matrix pattern of 3 by 3. A blade, not shown, is moved to an arrow direction, and the substrate frame 60 is saw-cut into a grid pattern so as to separate the individual unsealed package structures 64A. The substrate frame 60 on passing regions 66 of the blade is cut off by the saw-cutting. In such a manner, the individual unsealed package structures 64A formed with the resin dams 52 are separated.

(Step of Sealing the Semiconductor Chip)

Finally, the semiconductor chip 44 on each package is sealed by the sealing resin.

Figure 14:
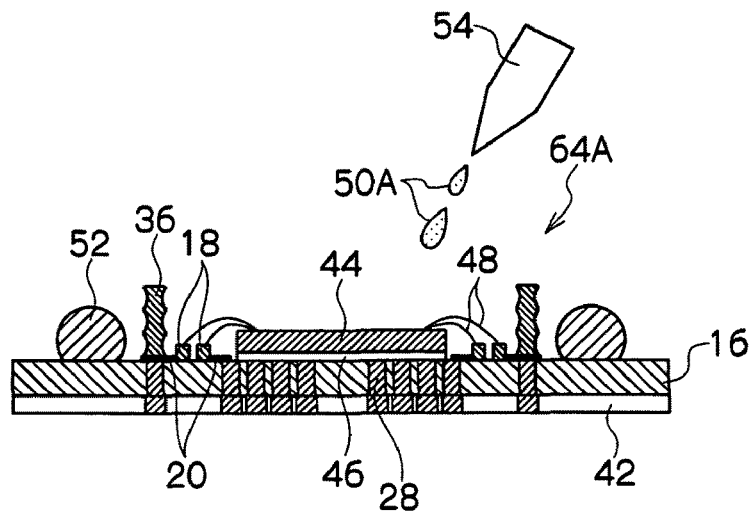
FIG. 14 is a diagram illustrating a manufacturing step according to the second exemplary embodiment, and a cross-sectional view illustrating a semiconductor chip sealing step.

FIG. 14 is a cross-sectional view illustrating the step of sealing the semiconductor chips.

The sealing using the sealing resin is carried out according to the dispensing method which allows the liquid resin 50A supplied from the dispenser 54 to naturally flow on the substrate similarly to the first exemplary embodiment. The liquid resin 50A is supplied from the dispenser 54 to the regions of the separated package structures 64A where the semiconductor chips 44 are arranged. The supplied liquid resin 50A naturally flows on the package structures 64A and uniformly spreads so as to be held back by the resin dams 52. As a result, the regions surrounded by the resin dams 52 are coated with the liquid resin 50A up to a height which is the approximately same as that of the resin dams 52.

After the coating, the liquid resin 50A is cured so as to be the sealing resin layer 50, and the step of sealing the semiconductor chip 44 is ended. The liquid resin 50A intrudes the gaps between the semiconductor chips 44 and the substrate frame 60, and the electrode pads 18, the wirings 20 and the metal wirings 48 as well as the semiconductor chips 44 are simultaneously sealed. In such a manner, the unsealed package structures 64A are sealed by the sealing resin layer 50, so that the double-sided electrode package 10A is completed. Rewiring may be carried out on the surface of the sealing resin layer 50.

Also in the second exemplary embodiment, since the liquid resin naturally flows so as to form the sealing resin layer 50, "the molding step" and "the grinding step" may be omitted. As a result, the sealing step may be simplified more greatly than the case where the resin sealing is carried out by the transfer molding method. Therefore, the double-sided electrode packages 10A may be manufactured more simply and inexpensively. Since the liquid resin is naturally flowed so as to form the sealing resin layer 50, the thin sealing resin layer 50 may be formed more easily than the transfer molding method and a method including transfer and grinding without using advanced manufacturing techniques.

The surface of the double-sided electrode package 10A is uniformly coated with the sealing resin layer 50 except for the end surfaces 36A of the surface-side terminals 36. Therefore, the peeling of the resin hardly occurs in comparison with the case where the surface of the double-sided electrode package 10A is coated with plural kinds of resins with different coefficients of thermal expansion and coefficients of thermal contraction.

Third Exemplary Embodiment

A third exemplary embodiment describes a method for manufacturing a double-sided electrode package where the semiconductor chips are mounted to the package substrate formed with the plural surface-side terminals having the plural protruded rims formed on the entire peripheries of their side surface in the peripheral direction, and the semiconductor chips are sealed by the liquid resin. In the third exemplary embodiment, the substrate frame formed with the plural package substrates is used, and after the double-sided electrode package structure is formed on the substrate frame, the substrate frame is divided (separated) into the individual double-sided electrode packages structures. These manufacturing steps are described. A difference from the first exemplary embodiment is that the spread of the liquid resin is controlled by not using a resin dam at the "step of sealing the semiconductor chips" but by surface tension of the liquid resin.

[Double-Sided Electrode Package]

Figure 15:
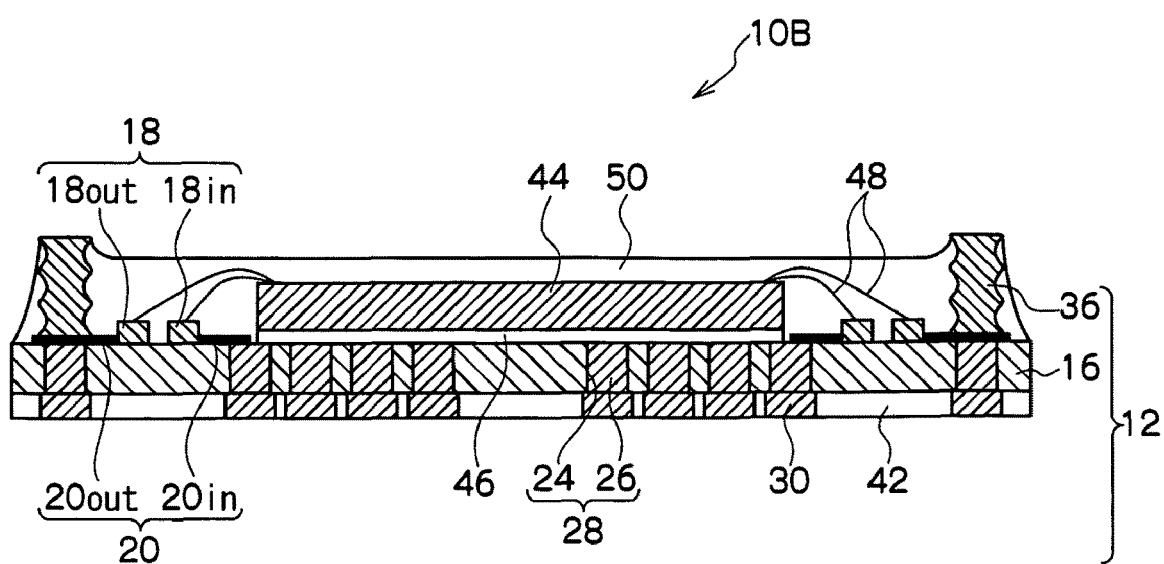
FIG. 15 is a schematic cross-sectional view illustrating a structure of the double-sided electrode package to be manufactured in a third exemplary embodiment of the invention.

FIG. 15 is a schematic cross-sectional view illustrating the structure of the double-sided electrode package to be manufactured in the third exemplary embodiment of the invention. The both-sided electrode package 10B has the same structure as that of the double-sided electrode package 10 in the first exemplary embodiment except that the thickness of an end portion of the sealing resin layer 50 is small. For this reason, like members are denoted by like symbols, and the description thereof is omitted.

The sealing resin layer 50 is formed on the package substrate 12 so that the height of its surface (sealing height) becomes lower than the end surfaces 36A of the surface-side terminals 36 inside the plural the surface-side terminals 36 similarly to the first exemplary embodiment. On the other hand, the thickness of the sealing resin layer 50 (sealing height) abruptly reduced toward the end portion outside the plural surface-side terminals 36. The "sealing height" is lower than the height of the surface-side terminals 36, but the side surfaces of the surface-side terminals 36 are sealed by the sealing resin layer 50 over the entire periphery.

Also in the third exemplary embodiment, each of the surface-side terminals 36 has the plural protruded rims similarly to the first exemplary embodiment. The undulating irregularly-shaped portion is formed on the side surfaces of the pillar-shaped surface-side terminals 36 by the plural protruded rims. When the side surfaces of the surface-side terminals 36 have the irregularly-shaped portion, the adhesion with the sealing resin is noticeably improved by the anchor effect. For this reason, the surface-side terminals 36 and the sealing resin layer 50 are hardly peeled from each other, and the moisture-resistant reliability of the double-sided electrode package 10B is noticeably improved. Further, even when the ambient temperature to which the double-sided electrode package 10B is exposed is changed and the metal-made surface-side terminals 36 expand and contract, the sealing resin layer 50 follow this state. For this reason, the reliability of the connection to a package to be laminated on an upper portion is noticeably improved.

[Method for Manufacturing the Double-Sided Electrode Package]

The method for manufacturing the double-sided electrode package 10B is described below. The double-sided electrode package 10B may be manufactured similarly to the double-sided electrode package 10 according to the first exemplary embodiment except for that the spread of the liquid resin is controlled not by the resin dam at the "step of sealing the semiconductor chip" but by the surface tension of the liquid resin. For this reason, the description other than the difference will be omitted.

The semiconductor chips 44 are arranged on the chip arrangement regions 14 of each package substrate 12 on the substrate frame 60 similarly to the first exemplary embodiment until the "step of arranging the semiconductor chip" (see FIGS. 5 to 8).

(Step of Sealing the Semiconductor Chip)

The semiconductor chips 44 are sealed by the sealing resin.

Figure 16A:
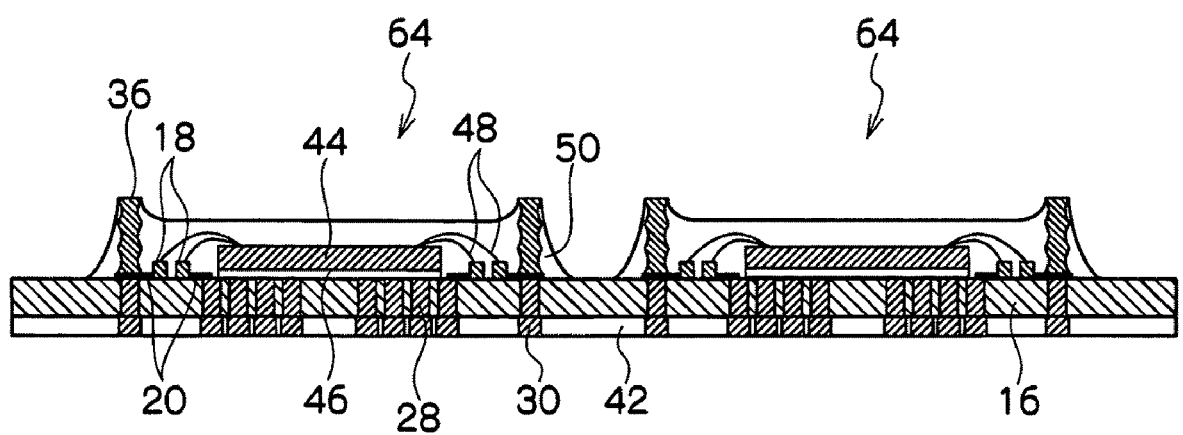
FIGS. 16A to 16C are diagrams illustrating manufacturing steps according to the third exemplary embodiment, and particularly diagrams illustrating semiconductor chip sealing step.
Figure 16B:
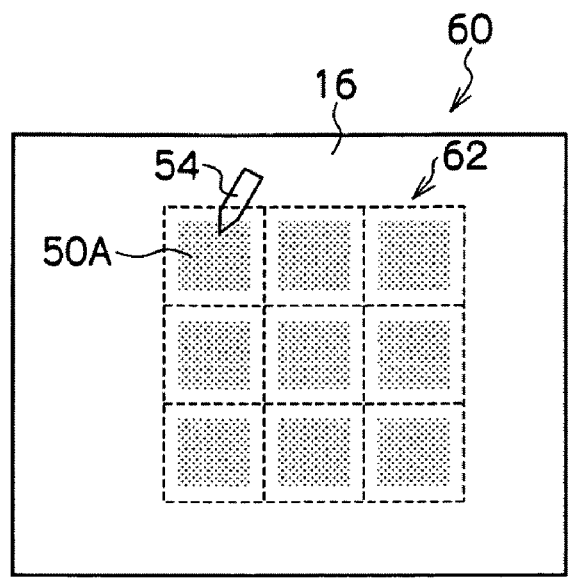
Figure 16C:
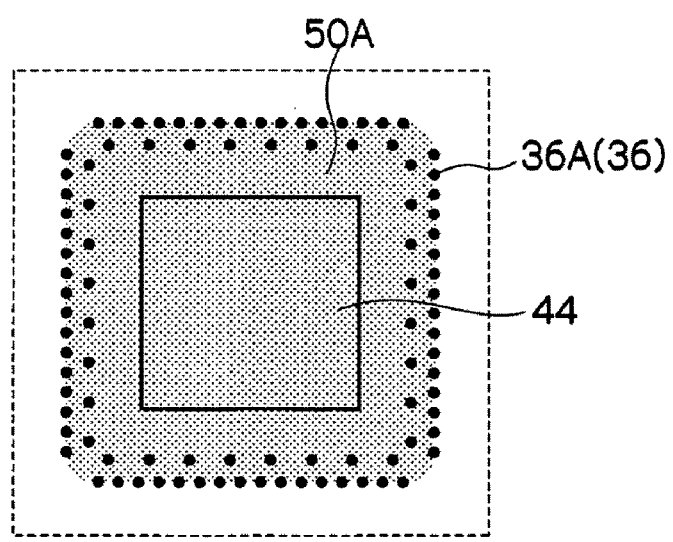

FIGS. 16A to 16C are diagrams illustrating the step of sealing the semiconductor chips. FIG. 16A is a partial cross-sectional view of the substrate frame sealed by resin, and FIG. 16B is a plan view when the resin-sealed substrate frame is viewed from the surface side. FIG. 16C is a plan view when one package is viewed from the surface side.

The region 62 (shown by the dotted line) formed with the plural package substrates 12 is arranged on the substrate frame 60 (core material 16). As shown in FIG. 16B, 9 package substrates 12 are arranged on the shown region 62 of the substrate frame 60 into a matrix pattern of 3 by 3. As shown in FIG. 16C, the plural surface-side terminals 36 are arranged on the peripheral portions of the package substrates 12 in a square to surround the semiconductor chip 44.

The sealing using the sealing resin is carried out by the dispensing method which makes the liquid resin 50A supplied from the dispenser 54 naturally flow on the substrate similarly to the first exemplary embodiment. As shown in FIG. 16B, the liquid resin 50A is supplied from the dispenser 54 to the regions on the substrate frame 60 where the semiconductor chips 44 are arranged. As shown in FIG. 16C, the supplied liquid resin 50A naturally flows on the substrate frame 60 and spreads uniformly, and remains near the forest of plurality of surface-side terminals 36 due to the surface retention of the liquid resin 50A. Resin with high viscosity such as solventless epoxy liquid resin is preferably used as the liquid resin 50A. As a result, the regions surrounded by the plural the surface-side terminals 36 and the side surfaces of the plural surface-side terminals 36 are coated with the liquid resin 50A.

After the coating, the liquid resin 50A is cured so as to be the sealing resin layer 50, and the step of sealing the semiconductor chip 44 is ended. The liquid resin 50A intrudes the gaps between the semiconductor chips 44 and the substrate frame 60, and the electrode pads 18, the wirings 20 and the metal wirings 48 as well as the semiconductor chip 44 are sealed simultaneously. Rewiring may be carried out on the surface of the sealing resin layer 50.

(Dicing Step)

Finally, the substrate frame 60 is diced to separate the respective packages.

In the structure after the step of sealing the semiconductor chips, as shown in FIG. 16A, the thickness of the sealing resin layer 50 (sealing height) abruptly reduces between the adjacent 2 package structures 64. The sealing resin layer 50 is not present in some portions. As to the other portions, the structure has the similar to that of the first exemplary embodiment shown in FIG. 9A. As shown in FIG. 9A, 9 double-sided electrode package structures 64 are arranged on the shown portion of the substrate frame 60 into a matrix pattern of 3 by 3.

In the third exemplary embodiment, similarly to the first exemplary embodiment, a blade, not shown, is moved to an arrow direction, and the substrate frame 60 is saw-cut into a grid pattern so as to separate the individual double-sided electrode package structures 64 as shown in FIG. 10B. The substrate frame 60 on the blade passing regions 66 is cut off by the saw-cutting so as to separate the individual double-sided electrode package structures 64. As a result, the double-sided electrode packages 10B are completed.

Also in the third exemplary embodiment, the liquid resin naturally flows so as to form the sealing resin layer 50, so that "the molding step" and "the grinding step" may be omitted. As a result, the sealing step may be simplified more greatly than the case where the resin sealing is carried out by the transfer molding method. Therefore, the double-sided electrode packages 10B may be manufactured more simply and inexpensively. Further, since the liquid resin is naturally flowed so as to form the sealing resin layer 50, the thin sealing resin layer 50 may be formed more easily than the transfer molding method and a method including transfer and grinding without using advanced manufacturing techniques.

The surface of the double-sided electrode package 10B is uniformly coated with the sealing resin layer 50 except for the end surfaces 36A of the surface-side terminals 36. Therefore, the peeling of the resin hardly occurs in comparison with the case where the surface of the double-sided electrode package 10B is coated with plural kinds of resins with different coefficients of thermal expansion and coefficients of thermal contraction.

Fourth Exemplary Embodiment

A fourth exemplary embodiment is one example of a POP module where 2 double-sided electrode packages are laminated and are packaged onto a mother board. Since the structure of the double-sided electrode package is the same as that manufactured in the first exemplary embodiment, like members are denoted by like symbols, and the description thereof is omitted.

[POP Module]

Figure 17:
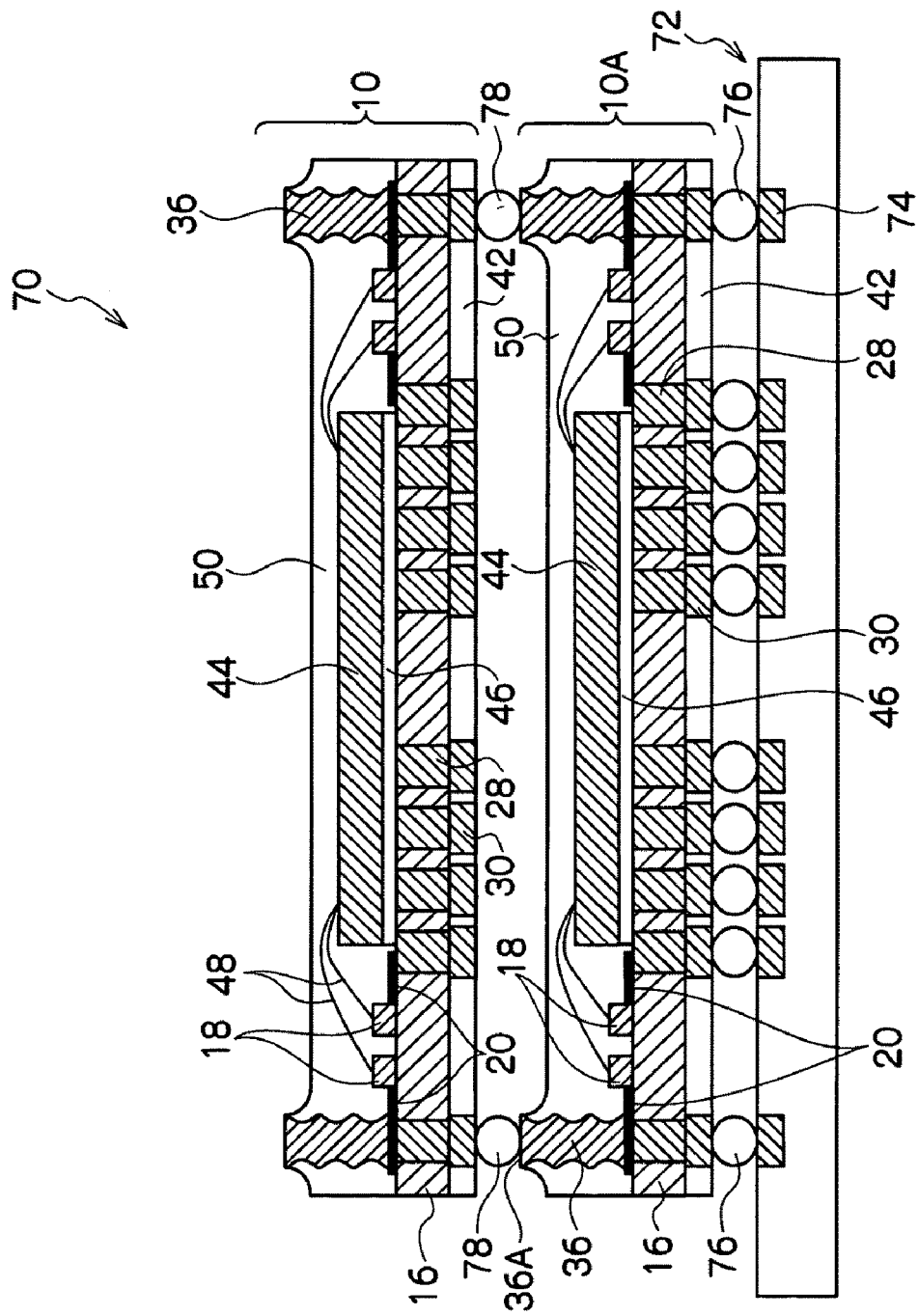
FIG. 17 is a schematic cross-sectional view illustrating a structure of a POP module according to a fourth exemplary embodiment of the invention.
Figure 18:
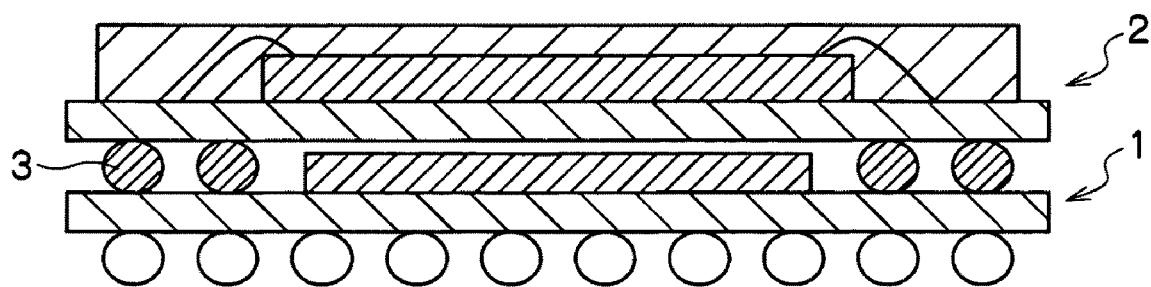
FIG. 18 is a schematic diagram illustrating a representative constitution of a conventional POP.

FIG. 17 is a schematic cross-sectional diagram illustrating the structure of the POP module according to the fourth exemplary embodiment of the invention. A POP module 70 according to the fourth exemplary embodiment includes a mother board 72, and 2 double-sided electrode packages 10. Plural connection pads 74 are formed on the surface of the mother board 72. The double-sided electrode package 10 is laminated on the mother board 72. The lands 30 on the back surface of the double-sided electrode package 10 are electrically connected to the connection pads 74 on the surface of the mother board 72 via the solder balls 76.

Another double-sided electrode package 10 is laminated on the double-sided electrode package 10. The end surfaces 36A of the surface-side terminals 36 are exposed from the surface of the lower electrode package 10. The lands 30 on the back surface of the upper double-sided electrode package 10 are electrically connected to the end surfaces 36A exposed from the surface of the lower double-sided electrode package 10.

[Step of Laminating the Package]

The solder balls 76 are welded to the lands 30 on the back surface of the double-sided electrode package 10. Solder paste (not shown) is applied to the end surfaces 36A exposed from the surface of the double-sided electrode package 10, and the solder balls 76 are welded via the solder paste. Solder balls 76 and 78 are formed as external terminals on the lower double-sided electrode package 10. The solder balls 76 of the double-sided electrode package 10 are pressure-welded with the connection pads 74 on the surface of the mother board 72, and the solder balls 78 are pressure-welded with the lands 30 on the back surface of the other double-sided electrode package 10. As a result, the two double-sided electrode packages 10 are laminated and packaged onto the mother board 72, so that the POP module 70 is completed.

2 double-sided electrode packages 10 have a structure such that the surface-side terminals 36 having plural protruded rims on their side surfaces are formed on the substrate and are buried into the sealing resin layer 50. For this reason, the adhesion between the surface-side terminals 36 and the sealing resin is noticeably improved by the anchor effect, and warpage and peeling hardly occur, so that the connection reliability and the moisture-resistant reliability are excellent. Therefore, in the fourth exemplary embodiment, 2 double-sided electrode packages 10 are laminated, so that the POP module having high reliability may be structured.

Modified Example of the Exemplary Embodiments

A modified example is described below.

The first to third exemplary embodiments describe the example that the cylindrical surface-side terminals are formed, however one end side of the surface-side terminals to be electrically connected to the wirings (base portions of the posts) may be thinner than the other ends. Conventionally, since the penetrating electrodes which electrically connect the surface and the back surface of the double-sided electrode package are formed by filling a conductive material into a through hole, the diameters of the penetrating electrodes are approximately constant, and a lower limit of the diameter is limited by the diameter of the solder balls formed as the external terminals. On the contrary, when only the base portions of the surface-side terminals are thinned, since the regions of the end surfaces to be exposed from the sealing resin does not change, the structure may cope with fine pitch of the substrate wirings due to the multi-pin structure of the semiconductor chip without damaging the connection to the package laminated on the upper side.

A stepped portion may be provided to one end side of the surface-side terminals to be electrically connected to the wirings (base portions of posts), and the stepped portions may function as bonding pads for connecting the semiconductor chips (the outside electrode pads 18$_{out}$ in FIG. 1). Since the stepped portions of the surface-side terminals function as the bonding pads for connecting the semiconductor chips, the wirings become simple. Therefore, an area where the semiconductor chips are mounted may be widened. Since the bonding pads are integral with the surface-side terminals, the outside wirings to be connected to one ends of the surface-side terminals may be formed into a pad shape.

The first to third exemplary embodiments describe the example where the rewiring pads are formed on the surface of the double-sided electrode package and the electrode pads are formed on the back surface of the double-sided electrode package. However, connection terminals may be further formed on the pads. For example, solder paste is applied to the pads so that an LGA (Land Grid Array) type package may be formed, or solder balls are provided to the pads so that a BGA (Ball Grid Array) type package may be formed.

The first to third exemplary embodiments describe the example that the package substrate is constituted by the plate-shaped core material composed of an insulator, the wirings, the penetrating electrodes, the electrode pads and the solder resist. However, the package substrate may be constituted by a multi-layered organic substrate with multi-layered wiring. The multi-layered organic substrate is obtained by forming a wiring pattern on each layer of the resin substrate composed of plural layers (for example, two to four layers) and forming via holes for connecting the wiring patterns on the respective layers as the need arises. A conductor layer is formed inside the via holes, and the conductor layers are connected to the lands as end surface electrode portions formed on the lower surface.

The first to third exemplary embodiments describe the example that one semiconductor chip may be housed in one double-sided electrode package. However, plural semiconductor chips may be housed in one double-sided electrode package.

In the first to third exemplary embodiments, the semiconductor chips are connected by wire bonding, but may be connected by flip chip via a bump.

The first to third exemplary embodiments describe the example that the cylindrical surface-side terminals are formed, but rectangular column-shaped surface-side terminals may be formed. An outer periphery shape of the cut surface at the time of cutting the pillar-shaped surface-side terminal along a surface parallel with the substrate (core material) surface is circular, oval or oblong shape, or a polygonal shape such as a square (quadrate, rectangular, parallelogram or diamond), pentagonal, hexagonal, heptagonal, or octagonal shape.

The fourth exemplary embodiment describes the example that the POP module is constituted by using 2 double-sided electrode packages 10 according to the first exemplary embodiment. However, the POP module may be constituted also by using the double-sided electrode package 10A in the second exemplary embodiment or the double-sided electrode package 10B in the third exemplary embodiment. Three or more layers may be laminated.

What is claimed is:

1. A method for manufacturing a semiconductor device, the method comprising:
    a) forming electrode pads to be electrically connected to electrodes of semiconductor chips on a surface of a package substrate and forming external connection pads electrically connected to the electrode pads on a back surface of the package substrate;
    b) laminating a metal film on the surface of the package substrate, forming a surface mask having a predetermined pattern on a surface of the metal film, the pattern being such that a plurality of pillar-shaped surface-side terminals, whose one ends are correspondingly electrically connected to the electrode pads, is formed on a peripheral portion on the surface of the package substrate, and etching the metal film to a predetermined depth using the surface mask to form pillar-shaped portions whose side surfaces are narrowed;
    c) repeating:
       i) a procedure for forming side surface masks for protecting the side surfaces of the pillar-shaped portions formed by etching; and
       ii) a procedure for etching the metal film to a predetermined depth using the side surface masks and the surface masks so as to form the pillar-shaped portions whose side surfaces are narrowed,
       until the package substrate is exposed, and
       removing the surface mask and the side surface mask after the package substrate is exposed, to form pillar-shaped surface-side terminals having a plurality of protruded rims formed over entire peripheries of their side surfaces along a peripheral direction;
    d) placing the semiconductor chips at a center of the surface of the package substrate and electrically connecting the electrodes to the electrode pads; and
    e) coating the surface of the package substrate with liquid resin so that the other ends of the surface-side terminals are exposed and the semiconductor chips are coated to seal the semiconductor chips with the liquid resin.

2. The method for manufacturing a semiconductor device of claim 1 wherein, in e) the sealing of the semiconductor chips with the liquid resin, the surface of the liquid resin is in a position lower than the other ends of the surface-side terminals, and side surfaces of the surface-side terminals are coated with the liquid resin due to surface tension of the liquid resin.

3. The method for manufacturing a semiconductor device of claim 2, wherein in e) the sealing of the semiconductor chips with the liquid resin, a partitioning member which holds up the liquid resin is arranged outside the peripheral portion on the surface of the package substrate so as to surround the peripheral portion, and after the partitioning member is arranged, the liquid resin is injected so as to cover the surface of the package substrate.

4. The method for manufacturing a semiconductor device of claim 2, wherein in e) the sealing of the semiconductor chips with the liquid resin, the liquid resin is allowed to remain near and inside the plurality of pillar-shaped surface-side terminals arranged on the peripheral portion on the surface of the package substrate by means of surface tension of the liquid resin so as to cover the surface of the package substrate.

5. The method for manufacturing a semiconductor device of claim 1, wherein in e) the sealing of the semiconductor chips with the liquid resin, a partitioning member which holds up the liquid resin is arranged outside the peripheral portion on the surface of the package substrate so as to surround the peripheral portion, and after the partitioning member is arranged, the liquid resin is injected so as to coat the surface of the package substrate.

6. The method for manufacturing a semiconductor device of claim 1, wherein in e) the sealing of the semiconductor chips with the liquid resin, the liquid resin is allowed to remain near and inside the plurality of-pillar-shaped surface-side terminals arranged on the peripheral portion on the surface of the package substrate by means of surface tension of the liquid resin so as to cover the surface of the package substrate.

7. The method for manufacturing a semiconductor device of claim 1, wherein in c), one end side of the surface-side terminals to be electrically connected to wirings is made thinner than the other end side.

8. The method for manufacturing a semiconductor device of claim 1, wherein c) further includes providing a stepped portion to one end side of the surface-side terminals to be electrically connected to wirings.

* * * * *